(12) United States Patent
Manders et al.

(10) Patent No.: US 11,296,150 B2
(45) Date of Patent: Apr. 5, 2022

(54) DISPLAY DEVICES WITH DIFFERENT LIGHT SOURCES IN PIXEL STRUCTURES

(71) Applicant: Nanosys, Inc., Milpitas, CA (US)

(72) Inventors: Jesse R. Manders, Mountain View, CA (US); Brian H. Berkeley, Milpitas, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 16/661,078

(22) Filed: Oct. 23, 2019

(65) Prior Publication Data

US 2020/0168673 A1 May 28, 2020

Related U.S. Application Data

(60) Provisional application No. 62/749,362, filed on Oct. 23, 2018.

(51) Int. Cl.
| | |
|---|---|
| *H01L 27/32* | (2006.01) |
| *H01L 51/50* | (2006.01) |
| *H01L 25/16* | (2006.01) |
| *H01L 51/52* | (2006.01) |
| *H01L 25/18* | (2006.01) |

(52) U.S. Cl.
CPC ........ *H01L 27/3211* (2013.01); *H01L 25/162* (2013.01); *H01L 25/167* (2013.01); *H01L 25/18* (2013.01); *H01L 51/502* (2013.01); *H01L 51/504* (2013.01); *H01L 51/5206* (2013.01); *H01L 51/5218* (2013.01); *H01L 51/5221* (2013.01); *H01L 51/5234* (2013.01); *H01L 51/5265* (2013.01); *H01L 2251/5307* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 2017/0221969 A1* | 8/2017 | Steckel | ............... H01L 27/3211 |
| 2018/0108872 A1* | 4/2018 | Li | ........................ H01L 27/3244 |
| 2019/0013365 A1* | 1/2019 | Lin | ..................... H01L 27/3225 |

(Continued)

*Primary Examiner* — Michelle Mandala
*Assistant Examiner* — Jordan M Klein
(74) *Attorney, Agent, or Firm* — Sterne, Kessler, Goldstein & Fox P.L.L.C.

(57) ABSTRACT

Embodiments of a display device are described. A display device includes first and second sub-pixels. The first sub-pixel includes a first light source having a multi-layer stack and a first substrate configured to support the first light source. The multi-layer stack includes an organic phosphor film or a quantum dot (QD) based phosphor film configured to emit a first light having a first peak wavelength. The first substrate includes a first control circuitry configured to independently control the first light source. The second sub-pixel includes a second light source and a second substrate configured to support the second light source. The second light source has a microLED or a miniLED configured to emit a second light having a second peak wavelength that is different from the first peak wavelength. The second peak wavelength can be in the blue wavelength region of the visible spectrum. The second substrate includes a second control circuitry configured to independently control the second light source.

19 Claims, 10 Drawing Sheets

(56) References Cited

U.S. PATENT DOCUMENTS

| | | | | |
|---|---|---|---|---|
| 2019/0189679 A1* | 6/2019 | Kwak | ................... | H01L 33/44 |
| 2019/0347979 A1* | 11/2019 | Ahmed | ................... | H01L 33/58 |
| 2020/0411489 A1* | 12/2020 | Ahmed | ............... | H01L 25/0753 |
| 2020/0411490 A1* | 12/2020 | Ahmed | ................ | H01L 27/124 |
| 2020/0411491 A1* | 12/2020 | Ahmed | ................ | H01L 27/124 |
| 2020/0411717 A1* | 12/2020 | Keates | ............... | H01L 33/0075 |

* cited by examiner

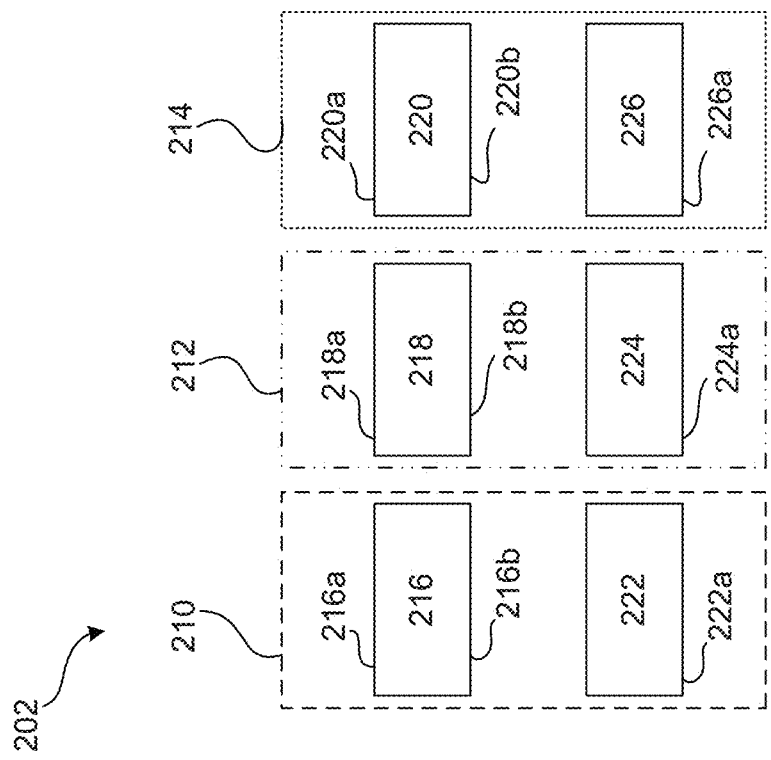
FIG. 2
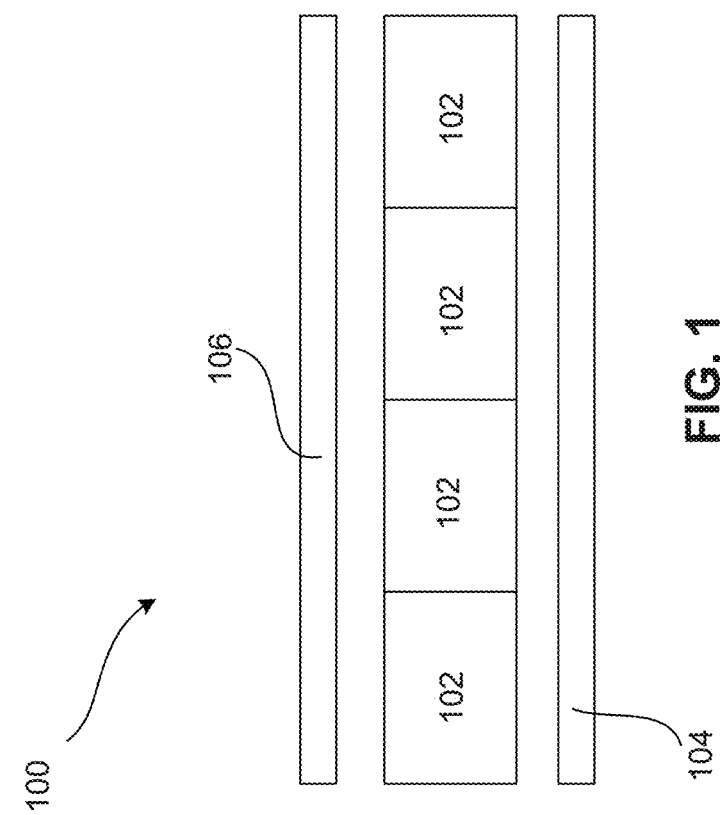
FIG. 1
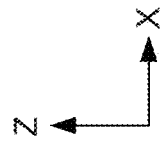

DISPLAY DEVICES WITH DIFFERENT LIGHT SOURCES IN PIXEL STRUCTURES

CROSS REFERENCE TO RELATED APPLICATIONS

This application incorporates by reference in their entirety U.S. Provisional Appl. No. 62/749,362, filed Oct. 23, 2018.

BACKGROUND OF THE INVENTION

Field

The present invention relates to display devices having pixels with electroluminescent light sources (e.g., light emitting diodes (LEDs)).

Background

Display devices such as phones, tablets, computers, or televisions are typically made using liquid crystal displays (LCDs) having a backlight unit that provides white light from one or more white LEDs, or blue primary light from one or more blue LEDs. If the backlight is comprised of white LEDs, a color filter array (CFA) is used to produce red, green, and blue sub-pixels. If the backlight is comprised of blue LEDs, the blue primary light is down-converted and/or filtered using respective down-conversion phosphor films and/or color filter array (CFA) to produce red, green, and blue light emitted from respective red, green, and blue sub-pixels of the LCDs. Some of the drawbacks of using LCDs are wasted light and reduced luminance due to color filtering, wasted energy due to the backlight unit being always on, lack of individual control of the sub-pixels, and/or Stokes shift in the down-conversion from the blue primary light to the other colors.

To overcome some of the drawbacks of LCDs, some display devices such as televisions can be made using white organic LEDs (WOLEDs), RGB OLEDs, or quantum dot LEDs (QLEDs), where each sub-pixel has its own WOLED, RGB OLED, or QLED based light source for individual control of the sub-pixels. However, these LED display devices also suffer from some drawbacks. For example, WOLED-based display devices employ color filters in addition to the WOLEDs having blue and yellow/orange OLEDs for each sub-pixel to emit red, green, and blue light. So, there is wasted light and reduced luminance due to color filtering.

Display devices using RGB OLEDs have the blue OLEDs in their blue sub-pixels turned off when no blue light is needed. However, materials used for blue OLEDs have an operational lifetime that is shorter and an efficiency that is lower as compared to the properties of materials used for red and green OLEDs in their respective red and green sub-pixels. This causes differential aging and subsequent color shifting in RGB OLED- and WOLED-based display devices over time, leading to a "burn-in" phenomenon. Besides, there is also the problem of OLED light extraction in RGB OLED-based display devices. The microcavities that are used in the sub-pixels of RGB OLED-based display devices to enhance forward emission and increase color purity cause a precipitous drop of luminance, and often a dramatic color shift, at off-normal viewing angles.

To overcome the need for microcavities and achieve wider color gamut and viewing angle, QLEDs have been used to replace RGB OLEDs in some LED display devices. The challenge is achieving a longer operational lifetime and efficiency for the blue QLEDs in the blue sub-pixels compared to the red and green QLEDs in respective red and green sub-pixels.

SUMMARY

Accordingly, there is a need for improved light sources in LED display devices that overcome the above-mentioned limitations. In some embodiments, an LED display device may have OLED and/or QLED as light sources in its red and/or green sub-pixels and blue microLED or miniLED as light sources in its blue sub-pixels. The blue microLEDs or miniLEDs may help to improve the LED display device efficiency compared to current LED display devices using blue OLEDs or QLEDs in their blue sub-pixels.

According to an embodiment, a display device includes first and second sub-pixels. The first sub-pixel includes a first light source having a multi-layer stack and a first substrate configured to support the first light source. The multi-layer stack includes an organic phosphor film or a quantum dot (QD) based phosphor film configured to emit a first light having a first peak wavelength. The first substrate includes a first control circuitry configured to independently control the first light source. The second sub-pixel includes a second light source and a second substrate configured to support the second light source. The second light source has a microLED or a miniLED configured to emit a second light having a second peak wavelength that is different from the first peak wavelength. The second substrate includes a second control circuitry configured to independently control the second light source.

According to an embodiment, a display device includes a pixel having first and second emission layers configured to emit first and second light having first and second peak wavelengths that are output from first and second sub-pixels of the pixel, respectively. The pixel further includes a cathode configured to provide negative charges to the first and second emission layers and an anode configured to provide positive charges to the first and second emission layers. The first and second emission layers are positioned between the cathode and the anode. The pixel further includes a light source having a microLED or a miniLED configured to emit a third light that is output from a third sub-pixel of the pixel. The third light has a third peak wavelength that is different from the first and second wavelengths.

According to an embodiment, a display device includes a pixel having a plurality of multi-layer stacks, a cathode configured to provide negative charges to the plurality of multi-layer stacks, and an anode configured to provide positive charges to the plurality of multi-layer stacks. At least a first and a second multi-layer stack of the plurality of multi-layer stacks are arranged in a tandem configuration between the cathode and the anode. The first and second multi-layer stacks have first and second emission layers configured to emit first and second light having first and second peak wavelengths that are output from first and second sub-pixels of the pixel, respectively. The pixel further includes a light source having a microLED or a miniLED configured to emit a third light that is output from a third sub-pixel of the pixel. The third light has a third peak wavelength that is different from the first and second wavelengths.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments disclosed herein and, together with the description, further serve to explain the principles of the present embodiments and to enable a person skilled in the relevant art(s) to make and use the present embodiments.

FIG. 1 is an exploded cross-sectional view of a light emitting diode (LED) display device, according to some embodiment.

FIG. 2 is a cross-sectional view of a pixel of an LED display device, according to some embodiments.

Figure 3:
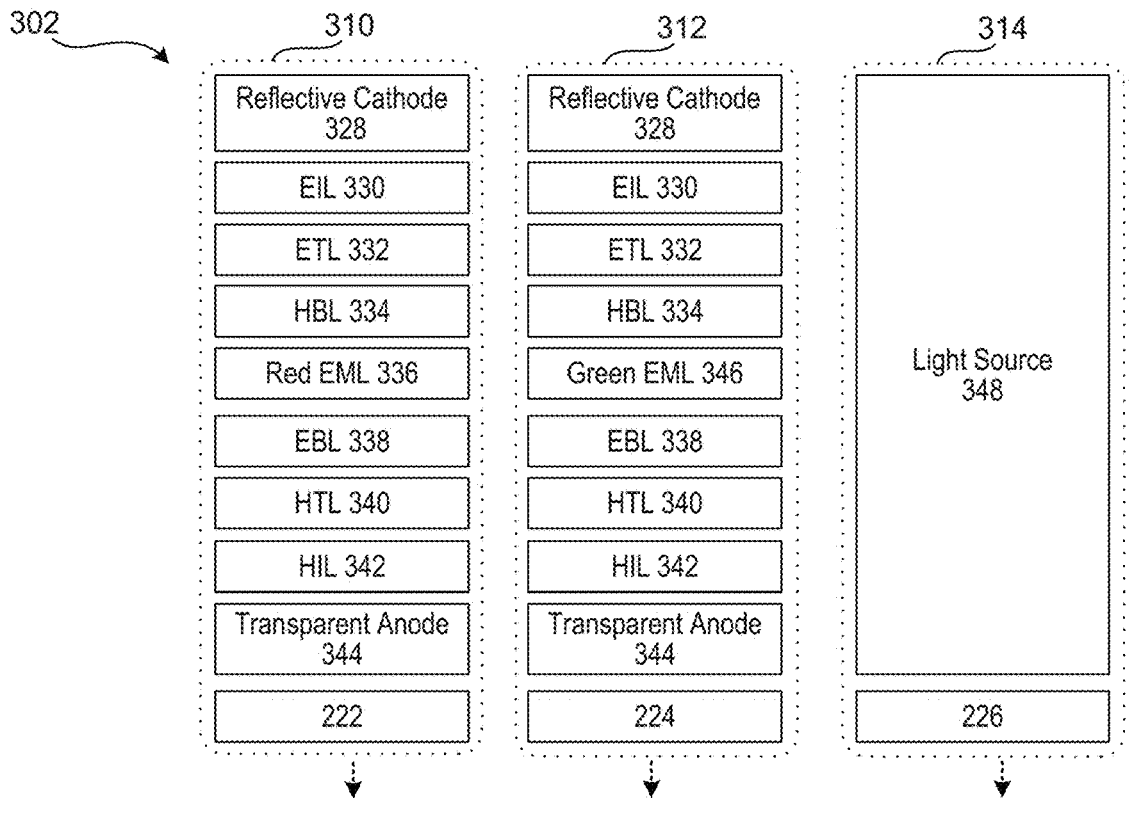
FIGS. 3-9 are cross-sectional views of pixels of bottom emission LED display devices, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements unless mentioned otherwise. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein. It should be appreciated that the particular implementations shown and described herein are examples and are not intended to otherwise limit the scope of the application in any way.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

In embodiments, the term "display device" refers to an arrangement of elements that allow for the visible representation of data on a display screen. Suitable display screens may include various flat, curved or otherwise-shaped screens, films, sheets or other structures for displaying information visually to a user. Display devices described herein may be included in, for example, display systems encompassing a liquid crystal display (LCD), televisions, computers, monitors, mobile phones, smart phones, personal digital assistants (PDAs), gaming devices, electronic reading devices, digital cameras, tablets, wearable devices, car navigation systems, digital signage, augmented reality, virtual reality, and the like.

The term "about" as used herein indicates the value of a given quantity varies by ±10% of the value. For example, "about 100 nm" encompasses a range of sizes from 90 nm to 110 nm, inclusive.

The term "substantially" as used herein indicates the value of a given quantity varies by ±1% to ±5% of the value.

In embodiments, the term "optically coupled" means that components are positioned such that light is able to pass from one component to another component without substantial interference.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to refers to a measure of spectral width. In the case of an emission spectrum, a FWHM can refer to a width of the emission spectrum at half of a peak intensity value.

The term Forster radius used herein is also referred as Forster distance in the art.

The term "nanostructure (NS) film" is used herein to refer to a film having luminescent nanostructures.

The term "red sub-pixel" is used herein to refer to an area of a pixel that emits light having a primary emission peak wavelength in the red wavelength region of the visible spectrum. In some embodiments, the red wavelength region may include wavelengths ranging from about 620 nm to about 750 nm.

The term "green sub-pixel" is used herein to refer to an area of a pixel that emits light having a primary emission peak wavelength in the green wavelength region of the visible spectrum. In some embodiments, the green wavelength region may include wavelengths ranging from about 495 nm to about 570 nm.

The term "blue sub-pixel" is used herein to refer to an area of a pixel that emits light having a primary emission peak wavelength in the blue wavelength region of the visible spectrum. In some embodiments, the blue wavelength region may include wavelengths ranging from about 435 nm to about 495 nm.

The term "partially reflective surface" is used herein to refer to a surface that has reflectivity between about 20% and about 90%.

The term "partially transparent" or "semitransparent" is used herein to refer to an element or a surface that has transmissivity between about 20% and about 90%.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

This disclosure provides various embodiments of LED display devices that help to overcome the above-mentioned limitations of current LED display devices. In some embodiments, an LED display device may have OLED and/or QLED as light sources in its red and/or green sub-pixels and blue microLED or miniLED as light sources in its blue sub-pixels. The blue microLEDs or miniLEDs may help to improve the LED display device efficiency compared to current LED display devices using blue OLEDs or QLEDs in their blue sub-pixels. The improved LED display device efficiency is due to the higher energy efficiency of blue microLEDs compared to blue OLEDs or QLEDs. The blue microLEDs or miniLEDs may also help improve the LED display device lifetime compared to the current LED display devices using blue OLEDs or QLEDs in their blue sub-pixels. The improved LED display lifetime is due to the longer lifetime of blue microLEDs compared to the blue OLEDs or QLEDs.

Example Embodiments of Led Display Devices

FIG. 1 illustrates a schematic of an exploded cross-sectional view of a light emitting diode (LED) display device 100, according to an embodiment. LED display device 100 can include a back plate 104, a plurality of pixels 102 arranged in a 2-D array on back plate 104, and a transmissive cover plate 106, according to some embodiments. The number of pixels shown in FIG. 1 is illustrative and is not limiting. Device 100 can have any number pixels without departing from the spirit and scope of this disclosure. Device 100 can be referred as an organic LED (OLED) display device if OLED-based light sources are used in pixels 102, as a microLED display device if microLED-based light sources are used in pixels 102, as a quantum dot LED (QLED) display device if QLED-based light sources are used in pixels 102, or a hybrid LED display device if a combination of OLEDs, QLEDs, and/or microLEDs are used in pixels 102.

Cover plate 106 can serve as a display screen to generate images and/or may be configured to provide environmental sealing to underlying structures of device 100. Cover plate 106 can be also configured to be an optically transparent substrate onto which other components (e.g., electrodes) of device 100 can be disposed. In some embodiments, pixels 102 can be tri-chromatic having red, green, and blue sub-pixels. In some embodiments, pixels 102 can be monochromatic having either red, green, or blue sub-pixels. In some embodiments, device 100 can have a combination of both tri-chromatic and monochromatic pixels 102.

Device 100 can further include control circuitry (not shown) of pixels 102. Pixels 102 can be independently controlled by switching devices such as, for example, thin film transistors (TFTs). Device 100 can have a geometric shape, such as but not limited to cylindrical, trapezoidal, spherical, or elliptical, according to some embodiments, without departing from the spirit and scope of the present invention. It should be noted that even though back plate 104, array of pixels 102, and cover plate 106 are shown in FIG. 1 to have similar dimensions along X-axis, a person skilled in the art would understand that each of these components may have dimensions different from each other in one or more directions, according to some embodiments.

FIG. 2 illustrates an exploded cross-sectional view of a tri-chromatic pixel 202 of an LED display device, according to some embodiments. One or more of pixels 102 of device 100 of FIG. 1 may have a configuration similar to pixel 202. Pixel 202 can include a red sub-pixel 210, a green sub-pixel 212, and a blue sub-pixel 214. The arrangement order of red, green, and blue sub-pixels 210, 212, and 214 is illustrative and is not limiting and may be arranged in any order with respect to each other.

Each of red, green, and blue sub-pixels 210, 212, and 214 can include a respective LED-based light source 216, 218, and 220. In some embodiments, each of light sources 216, 218, and 220 can be configured to provide a respective primary red, green, and blue light that may be transmitted to and distributed across a display screen (e.g., cover plate 106) of an LED display device (e.g., device 100). In some embodiments, light sources 216, 218, and 220 can be configured to emit light from surfaces 216a, 218a, and 220a, respectively, when pixel 202 is part of a top emission LED display or from surfaces 216b, 218b, and 220b, respectively, when pixel 202 is part of a bottom emission LED display.

In some embodiments, light source 216 can be configured to emit light having a primary emission peak wavelength in the red wavelength region of the visible spectrum. The red wavelength region may include wavelengths ranging from about 620 nm to about 750 nm. In some embodiments, light source 218 can be configured to emit light having a primary emission peak wavelength in the green wavelength region of the visible spectrum. The green wavelength region may include wavelengths ranging from about 495 nm to about 570 nm. In some embodiments, light source 220 can be configured to emit light having a primary emission peak wavelength in the blue wavelength region of the visible spectrum. The blue wavelength region may include wavelengths ranging from about 435 nm to about 495 nm.

In some embodiments, each of red, green, and blue sub-pixels 210, 212, and 214 can further include a substrate 222, 224, and 226, respectively, configured to support respective light sources 216, 218, and 220. Substrates 222, 224, and 226 can be further configured to support control circuitry (e.g., TFTs) for independently controlling respective red, green, and blue sub-pixels 210, 212, and 214. In some embodiments, substrates 222, 224, and 226 can be optically transparent when pixel 202 is part of a bottom emission LED display device or may be optically reflective, opaque, transparent, or semi-transparent when pixel 202 is part of a top emission LED display device. Substrates 222, 224, and 226 can be portions of a single substrate, according to some embodiments.

In some embodiments, each of red, green, and blue sub-pixels 210, 212, and 214 can further include optional color processing elements (not shown in FIG. 2). The optional color processing elements may include one or more phosphor films and/or color filters disposed on surfaces 216a, 218a, and 220a in a top emission LED display device or on surfaces 222a, 224a, and 226a in a bottom emission LED display device. In some embodiments, the optional color processing elements may be part of light sources 216, 218, 220, or cover plate 106 in the top emission LED display device or may be part of substrates 222, 224, and 226 or back plate 104 in the bottom emission display device. The one or more phosphor films of the optional color processing elements may have luminescent nanostructures (NS) such as QDs (e.g., NS 1700 described with reference to FIG. 17).

FIGS. 3-16 illustrate exploded cross-sectional views of tri-chromatic pixels 302-1602, respectively, of an LED display device, according to some embodiments. Each of pixels 302-1602 can represent an example embodiment of pixel 202. Pixels 302-1602 can include red sub-pixels 310-1610, green sub-pixels 312-1612, and blue sub-pixels 314-1114, respectively. The red, green, and blue light emitted from each of these sub-pixels are represented by black arrows. The black arrows pointing towards +Z-direction indicates emission of light from top of the display device, and the black arrows pointing towards −Z-direction indicates emission of light from bottom of the display device.

Each of sub-pixels 310-1610 (FIGS. 3-16), 312-1612 (FIGS. 3-16), and 314-1114 (FIGS. 3-16) may represent an example embodiment of sub-pixels 210, 212, and 214, respectively. The arrangement order of these red, green, and blue sub-pixels 310-1610, 312-1612, and 314-1114 of respective pixels 302-1602 is illustrative and is not limiting and may be arranged in any order with respect to each other. Each portion of red sub-pixels 310-1610 (FIGS. 3-16), green sub-pixels 312-1612 (FIGS. 3-16), and blue sub-pixels 314-1114 (FIGS. 3-16) on respective substrates 222, 224, and 226 can represent an example embodiment of light sources 216, 218, and 220, respectively.

The discussion of elements with the same annotations in FIGS. 1-16 applies to each other unless mentioned otherwise. The elements described in this disclosure as being on or over other elements may be directly on with the other elements or may have intervening layers unless mentioned otherwise. It should be noted that even though some of the elements of FIGS. 3-16 are shown to have similar dimensions along X- and Z-axes with respect to each other, a person skilled in the art would understand that each of these elements may have dimensions different from each other in one or more directions, according to some embodiments.

In some embodiments, the red, green, and blue sub-pixels of each of pixels 302-1602 (FIGS. 3-16) may include light sources that are same or different from each other. These light sources may be OLEDs, QLEDs, microLEDs, miniLEDs, or a combination thereof. In some embodiments, the light sources of the red and green sub-pixels of each of pixels 302-1602 can be similar to each other, but different from the light source of the blue sub-pixel. The blue sub-pixel of each of pixels 302-1602 can have blue, violet, or UV microLED or miniLED light source, while the red and green sub-pixels have OLED or QLED light sources to overcome the above-mentioned problems of achieving longer operational lifetime and efficiency for blue sub-pixels. Blue, violet, or UV microLEDs or miniLEDs have higher luminance, higher energy efficiency, and longer operational lifetime compared to other blue, violet, or UV light sources (e.g., OLEDs or QLEDs). In addition, compared to OLEDs and QLEDs, blue, violet, or UV microLEDs may have narrower FWHM that results in higher color purity. Similar to OLEDs and QLEDs, microLEDs or miniLEDs are individually controllable.

Each of pixels 302-902 of respective FIGS. 3-9 can represent a pixel structure of a bottom emission LED display device, where light may be emitted through substrates 222, 224, and 226 towards a display screen (e.g., back plate 104). Red, blue, and green light (represented by black arrows in FIGS. 3-9) from respective red, green, and blue sub-pixels of pixels 302-902 can be emitted through respective substrates 222, 224, and 226.

Figure 4:
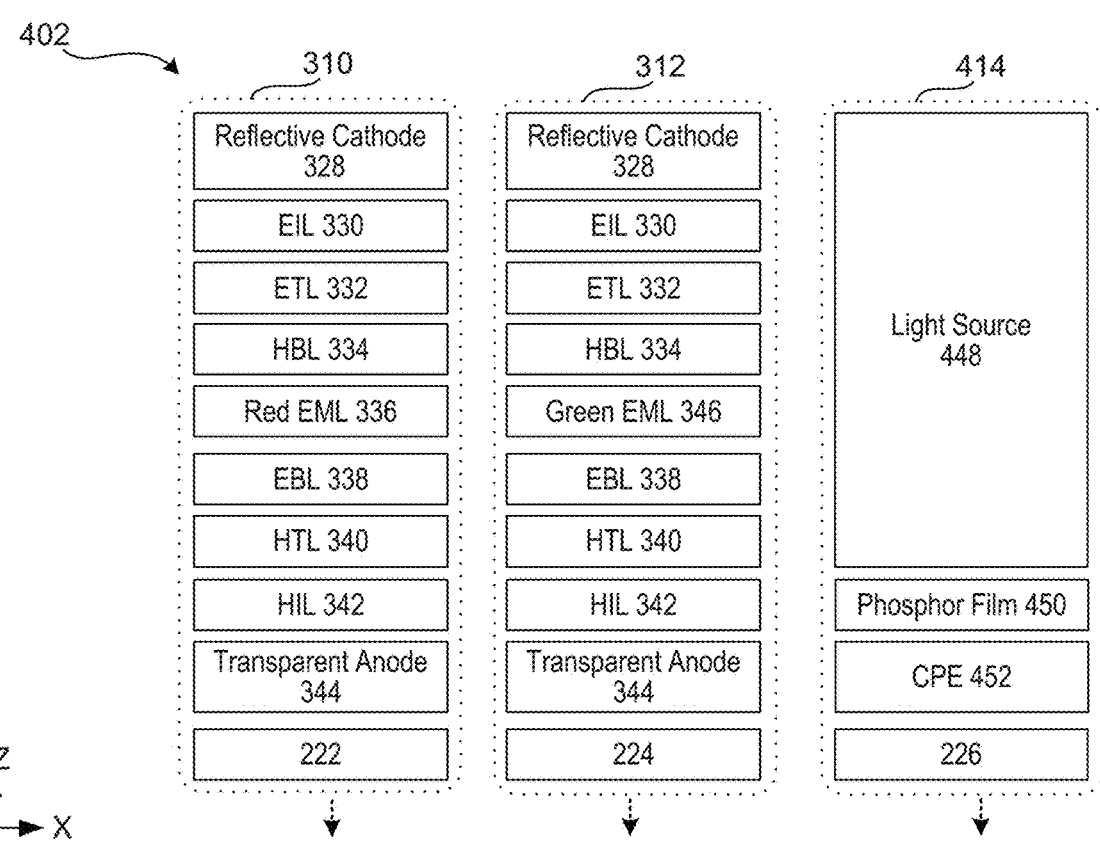

Referring to FIGS. 3 and 4, pixels 302 and 402 can include similar red sub-pixels 310 and green sub-pixels 312, but different blue sub-pixels 314 and 414, respectively. Blue sub-pixel 314 of FIG. 3 can include a blue microLED- or miniLED-based light source 348 positioned on substrate 226. The blue microLED- or miniLED-based light source 348 can be formed on a wafer that has a lateral dimension less than about 100 μm or between about 100 μm and about 10000 μm, respectively. The structure of the blue microLED- or miniLED-based light source 348 can be based on a p-n junction diode having direct bandgap semiconductor materials, such as binary III-V (e.g., GaN) compounds, ternary III-V compounds (e.g., InGaN), quaternary III-V compounds (e.g. AlInGaN), or a combination thereof. In operation, the blue microLED- or miniLED-based light source 348 can emit blue light when its p-n junction diode is forward biased, which causes electrons from conduction band(s) to recombine with holes from valence band(s) of its semiconductor material(s) to release photons corresponding to wavelengths in the blue wavelength region of the visible spectrum. In some embodiments, the blue wavelength region may include wavelengths ranging from about 435 nm to about 495 nm.

Similar to blue sub-pixel 314, blue sub-pixel 414 of FIG. 4 can emit blue light having primary emission peak wavelength in the blue wavelength region of the visible spectrum light. But, unlike blue sub-pixel 314, blue sub-pixel 414 can include a violet or UV color microLED- or miniLED-based light source 448 and a phosphor film 450 (e.g., NS film 1800 described with reference to FIG. 18) having luminescent nanostructures such as QDs (e.g., NS 1700 described with reference to FIG. 17). Phosphor film 450 can be positioned between light source 448 and substrate 226 and may be configured to down-convert the violet or UV light emitted from light source 448 into the blue light emitted from blue sub-pixel 414. In some embodiments, phosphor film 450 can have a thickness between about 10 nm to about 500 μm. In some embodiments, phosphor film 450 may include scattering material (e.g., particles having diameters ranging from about 100 nm to about 500 μm) of titanium oxide, zinc oxide, zinc sulfide, silicone, or a combination thereof, with the luminescent nanostructures. Phosphor film 450 can be deposited by, for example, spin coating, inkjet printing, slot die coating, nozzle printing, contact printing, another suitable solution printing technology, thermal evaporation, or a suitable vapor deposition technology and then patterned by, for example, a lithographic process. The violet or UV microLED- or miniLED-based light source 448 can have dimensions similar to light source 348 and may be based on a p-n junction diode having binary III-V compounds (e.g. GaN), ternary III-V compounds (e.g., AlGaN, InGaN), or a combination thereof.

In some embodiments, blue sub-pixel 414 can further include a color processing element (CPE) 452 positioned between phosphor film 450 and substrate 226. CPE 452 can have one or more non-phosphor films that exclude luminescent nanostructures such as QDs (e.g., NS 1700 described with reference to FIG. 17) and have color filtering properties to filter out (e.g., absorb, block, reflect, scatter, or a combination thereof) one or more selective wavelengths or range of wavelengths from the blue light from phosphor film 450. This filtering may help to modify (e.g., shift) the primary emission peak wavelength or spectral shape of the blue light that is emitted from phosphor film 450 to a desired wavelength or spectral shape.

The one or more non-phosphor films of CPE 452 can include dye (e.g., narrow band organic Exciton P491 dye or Exciton ABS430 dye), ink, paint, polymeric material, and/or any material that may be deposited by spraying, painting, spin-coating, printing, transferring or any other suitable deposition method. Printing may be done using, for example, a plotter, an inkjet printer, or a screen printer. Patterning may be done, for example, by photolithography. In some embodiments, the one or more non-phosphor films may be directly disposed on substrate 226.

In some embodiments, the one or more non-phosphor films of CPE 452 can include scattering particles (e.g., particles having diameters ranging from about 100 nm to about 500 μm) of titanium oxide, zinc oxide, zinc sulfide, silicone, or a combination thereof. In some embodiments, CPE 452 can be dichroic filters that, for example, may reflect the one or more selective wavelengths or range of wavelengths of the blue light from phosphor film 450.

The following discussion of sub-pixels 310 and 312 refers to FIGS. 3 and 4 that illustrate pixels 302 and 402, respectively, having similar structures of sub-pixels 310 and 312. Red sub-pixel 310 can include a multilayer stack disposed on substrate 222. The multilayer stack of red sub-pixel 310 can include a transparent anode 344 on substrate 222, a hole injection layer (HIL) 342 on transparent anode 344, a hole transport layer (HTL) 340 on HIL 342, an electron blocking layer (EBL) 338 on HTL 340, a red emission layer (EML) 336 on EBL 338, a hole blocking layer (HBL) 334 on EML 336, an electron transport layer (ETL) 332 on HBL 334, an electron injection layer (EIL) 330 on ETL 332, and a reflective cathode 328 on EIL 330.

Similar to red sub-pixel 310, green sub-pixel 312 can include a multilayer stack on substrate 224. The multilayer stack of green sub-pixel 312 can be similar to that of red sub-pixel 310 except that green sub-pixel 312 has a green EML 346 on EBL 338 instead of red EML 336. In some embodiments, each of EMLs 336 and 346 can include one or more organic phosphor films, one or more QD-based phosphor films, or a combination thereof. Based on the type of EML, such as, for example, organic phosphor film or QD-based phosphor film used in these multilayer stacks, each of these multilayer stacks may form an OLED- or a QLED-based light source, respectively. In some embodiments, the QD-based phosphor film (e.g., NS film 1800 described with reference to FIG. 18) may include luminescent NSs such as QDs (e.g., NS 1700 described with reference to FIG. 17). In some embodiments, EMLs 336 and 346 can be different regions of a continuous film. EMLs 336 and 346 can be formed by, for example, spin coating, inkjet printing, slot die coating, nozzle printing, contact printing, a suitable solution printing technology, thermal evaporation, or a suitable vapor deposition technology.

The organic material of the organic phosphor film or the size and material of QDs of the QD-based phosphor film in red EML 336 can be selected such that red sub-pixel 310 can emit red light when a voltage is applied across the multilayer stack of red sub-pixel 310 during operation. The red light may be produced when the voltage is applied because electrons and holes recombine in red EML 336 to release photons corresponding to wavelengths in the red wavelength region of the visible spectrum. The electrons and holes may be injected from cathode 328 and anode 344, respectively, of red sub-pixel 310 when the voltage is applied such that anode 344 is positive with respect to cathode 328. In some embodiments, the red wavelength region may include wavelengths ranging from about 620 nm to about 750 nm.

Similarly, the organic material of the organic phosphor film or the size and material of QDs of the QD-based phosphor film in green EML 346 can be selected such that green sub-pixel 312 can emit green light when a voltage is applied across the multilayer stack of green sub-pixel 312 during operation. The green light may be produced when the voltage is applied because electrons and holes recombine in green EML 346 to release photons corresponding to wavelengths in the green wavelength region of the visible spectrum. In some embodiments, the green wavelength region may include wavelengths ranging from about 495 nm to about 570 nm.

Still referring to FIGS. 3 and 4, transparent anodes 344 can be configured to inject holes to the multilayer stacks when positively biased during operation, as discussed above.

Transparent anodes 344 can include electrically conductive and optically transparent materials such as, for example, indium-tin-oxide (ITO), according to some embodiments. In some embodiments, anodes 344 of red and green sub-pixels 310 and 312 can be formed as separate anodes on respective substrates 222 and 224 by depositing and patterning the electrically conductive and optically transparent materials on respective substrates 222 and 224. The deposition may be performed by, for example, sputtering, thermal evaporation, or a suitable method for depositing electrically conductive and optically transparent materials. The patterning may be performed by, for example, a lithography process or a masking process during the deposition. In some embodiments, an insulating matrix (not shown) may be formed between anodes 344 of red and green sub-pixels 310 and 312 to electrically and/or optically isolate them.

HILs 342 formed directly on anodes 344 can be configured to facilitate the injection of holes from anodes 344 into HTLs 340. In some embodiments, HILs 342 can include p- or n-type, organic or inorganic semiconductor materials such as, for example, metal oxides (e.g., nickel oxide (NiO), molybdenum oxide ($MoO_3$), vanadium oxide ($V_2O_5$), tungsten oxide ($WO_3$)), polyanilines, polythiophenes (e.g., poly (3,4-ethylenedioxythiophene) doped with poly(styrene sulfonate)), Tris[phenyl(m-tolyl)amino]triphenylamine (mTDATA), or hexaazatriphenylene-hexacarbonitrile (HAT-CN). HILs 342 can be deposited on anodes 344 by, for example, spin coating, inkjet printing, slot die coating, nozzle printing, contact printing, a suitable solution printing technology, thermal evaporation, or a suitable vapor deposition technology.

HTLs 340 formed on HILs 342 can be configured to facilitate the transportation of holes from HILs 342 of red and green sub-pixels 310 and 312 to red EML 336 and green EML 346, respectively. In some embodiments, HTLs 340 can include p-type, organic or inorganic semiconductor materials such as, for example, metal oxides or nanostructures of metal oxides (e.g., nickel oxide (NiO), molybdenum oxide ($MoO_3$), vanadium oxide ($V_2O_5$), or tungsten oxide ($WO_3$)), or polymers (e.g., poly(N-vinylcarbazole), poly (triarylamines), triphenylamine derivatives, or carbazole derivatives), or small organic molecules (e.g. N,N'-Di(1-naphthyl)-N,N'-diphenyl-(1,1'-biphenyl)-4,4'-diamine (NPB)).

In some embodiments, HTLs 340 and HILs 342 can include material similar or different from each other. In some embodiments, HTLs 340 can be deposited on HILs 342 by, for example, spin coating, inkjet printing, slot die coating, nozzle printing, contact printing, a suitable solution printing technology, thermal evaporation, or a suitable vapor deposition technology.

Optionally, EBLs 338 can be formed on HTLs 340 as intervening layers between EML 336 and HTL 340 of red sub-pixel 310 and between EML 346 and HTL 340 of green sub-pixel 312. EBLs 338 can be configured to block electrons from escaping EMLs 336 and 346 by acting as a large energy barrier between HTLs 340 and EMLs 336 and 346. EBLs 338 can include p-type semiconductor materials that have a shallow conduction band, such as, for example, carbazole and triphenylene based organic compounds. In some embodiments, EBLs 338 can be deposited on HTLs 340 by, for example, spin coating, inkjet printing, slot die coating, nozzle printing, contact printing, a suitable solution printing technology, thermal evaporation, or a suitable vapor deposition technology.

Similar to EBLs 338, HBLs 334 can be optionally formed on EMLs 336 and 346 as intervening layers between EML 336 and ETL 332 of red sub-pixel 310 and between EML 346 and ETL 332 of green sub-pixel 312. HBLs 334 can be configured to block holes from escaping EMLs 336 and 346 by acting as a large energy barrier between ETLs 332 and EMLs 336 and 346. HBLs 334 can include n-type semiconductor materials that have a deep valence band, such as, for example, substituted benzimidazoles organic compounds. In some embodiments, HBLs 334 can formed by, for example, spin coating, inkjet printing, slot die coating, nozzle printing, contact printing, a suitable solution printing technology, thermal evaporation, or a suitable vapor deposition technology.

ETLs 332 can be formed on HBLs 334 or on EMLs 336 and 346 if HBLs 334 are optionally not included. ETLs 332 can be configured to facilitate the transportation of electrons from EILs 330 of red and green sub-pixels 310 and 312 to red EML 336 and green EML 346, respectively. In the absence of HBLs 334, ETLs 332 can be configured to block holes from escaping EMLs 336 and 346. In some embodiments, ETLs 332 can include n-type, organic or inorganic semiconductor materials such as, for example, metal oxides or nanostructures of metal oxides (e.g., zinc oxide (ZnO), zinc magnesium oxide (ZnMgO), or titanium oxide ($TiO_2$)) or benzimidazole derivatives. In some embodiments, ETLs 332 can be formed by, for example, spin coating, inkjet printing, slot die coating, nozzle printing, contact printing, a suitable solution printing technology, thermal evaporation, or a suitable vapor deposition technology.

EILs 330 formed on ETLs 332 can be configured to facilitate the injection of electrons from reflective cathodes 328 into ETLs 332 by forming an ohmic or near ohmic contact with reflective cathodes 328. In some embodiments, EILs 330 can include n-type semiconductor materials, alkali metal salts (e.g., lithium fluoride (LiF) or cesium carbonate ($Cs_2CO_3$)), low work function metals (e.g., calcium (Ca), barium (Ba), magnesium (Mg), ytterbium (Yb), or cesium (Cs)), or organic compounds (e.g., polyfluorenes, polyethylenimine ethoxylated (PETE), or lithium-8-hydroxyquinolinolate (Liq)). In some embodiments, ETLs 332 and EILs 330 can include material similar or different from each other. EILs 330 can be deposited on ETLs 332 by, for example, spin coating, inkjet printing, slot die coating, nozzle printing, contact printing, a suitable solution printing technology, thermal evaporation, or a suitable vapor deposition technology.

In some embodiments, red and green sub-pixels 310 and 312 can each include a plurality of EILs, ETLs, HTLs, and HILs similar to EILs 330, ETLs 332, HTLs 340, and HILs 342, respectively. Each EIL, ETL, HTL, and HIL of the plurality of EILs, ETLs, HTLs, and HILs may include material similar or different from each other, respectively.

Reflective cathodes 328 formed directly on EILs 330 can be configured to inject electrons to the multilayer stacks when negatively biased during operation, as discussed above. Cathodes 328 can include electrically conductive and optically reflective materials such as, for example, aluminum (Al) or silver (Ag), according to some embodiments. In some embodiments, each of cathodes 328 can include at least one non-reflective electrically conductive layer (e.g., ITO, Yb, or Mg:Ag alloy) and at least one reflective layer (e.g., Ag or Al). The reflective materials or layers of reflective cathodes 328 can help to reflect light towards substrates 222 and 224 and prevent light from being emitted through cathodes 328. The light that is produced due to the release of photons after the recombination of electrons and holes in EMLs 336 and 346 (discussed above) may travel towards cathodes 328 and substrates 222 and 224. The reflective materials or layers of reflective cathodes 328 helps to redirect these photons towards substrates 222 and 224 for emission from red and green sub-pixels 310 and 312.

In some embodiments, cathodes 328 of red and green sub-pixels 310 and 312 can be formed as separate cathodes on respective EILs 330 of red and green sub-pixels 310 and 312 by depositing and patterning the cathode materials on respective substrates 222 and 224. The deposition may be performed by, for example, sputtering, thermal evaporation, a suitable solution printing technology, or a suitable method for depositing electrically conductive and optically reflective materials. The patterning may be performed by, for example, a lithography process.

In FIGS. 3-4, EIL 330, ETL 332, HBL 334, EBL 338, HTL 340, and HIL 342 of red sub-pixel 310 can include material similar, the same, or different from EIL 330, ETL 332, HBL 334, EBL 338, HTL 340, and HIL 342 of green sub-pixel 312, respectively. In the above discussion of FIGS. 3-4, reflective cathodes 328, EILs 330, ETLs 332, HBLs 334, EBLs 338, HTLs 340, and HILs 342 have been shown to be separate layers for red and green sub-pixels 310 and 312. However, in some embodiments, any number of these layers may be shared between red and green sub-pixels of a pixel as shown in FIG. 5.

Figure 5:
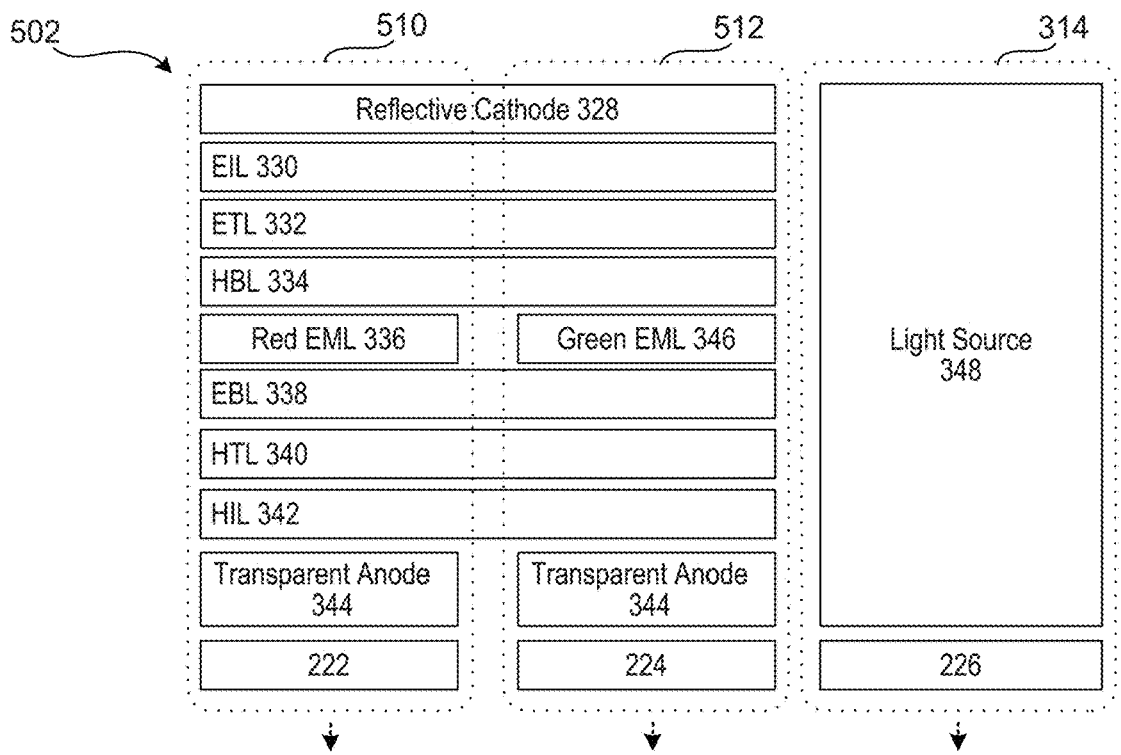

FIG. 5 illustrates an exploded cross-sectional view of a tri-chromatic pixel 502 of a bottom emission LED display device. The discussion of pixels 302 and 402 applies to pixel 502 unless mentioned otherwise. Pixel 502 can include red, green, and blue sub-pixels 510, 512, and 314. In some embodiments, red and green sub-pixels 510 and 512 can be similar to red and green sub-pixels 310 and 312, respectively, except that each of reflective cathodes 328, EIL 330, ETLs 332, HBLs 334, EBLs 338, HTLs 340, and HILs 342 can be shared between red and green sub-pixels 510 and 512 and not be separate layers as in FIGS. 3-4. Portions of reflective cathodes 328, EIL 330, ETLs 332, HBLs 334, EBLs 338, HTLs 340, and HILs 342 stacked over substrates 222 and 224 are part of red and green sub-pixels 510 and 512, respectively. Even though, EIL 330, ETLs 332, HBLs 334, EBLs 338, HTLs 340, and HILs 342 are shown to be shared between red and green sub-pixels 510 and 512, each or some of EIL 330, ETLs 332, HBLs 334, EBLs 338, HTLs 340, and HILs 342 can be separate layers as in FIGS. 3-4, according to some embodiments.

Figure 6:
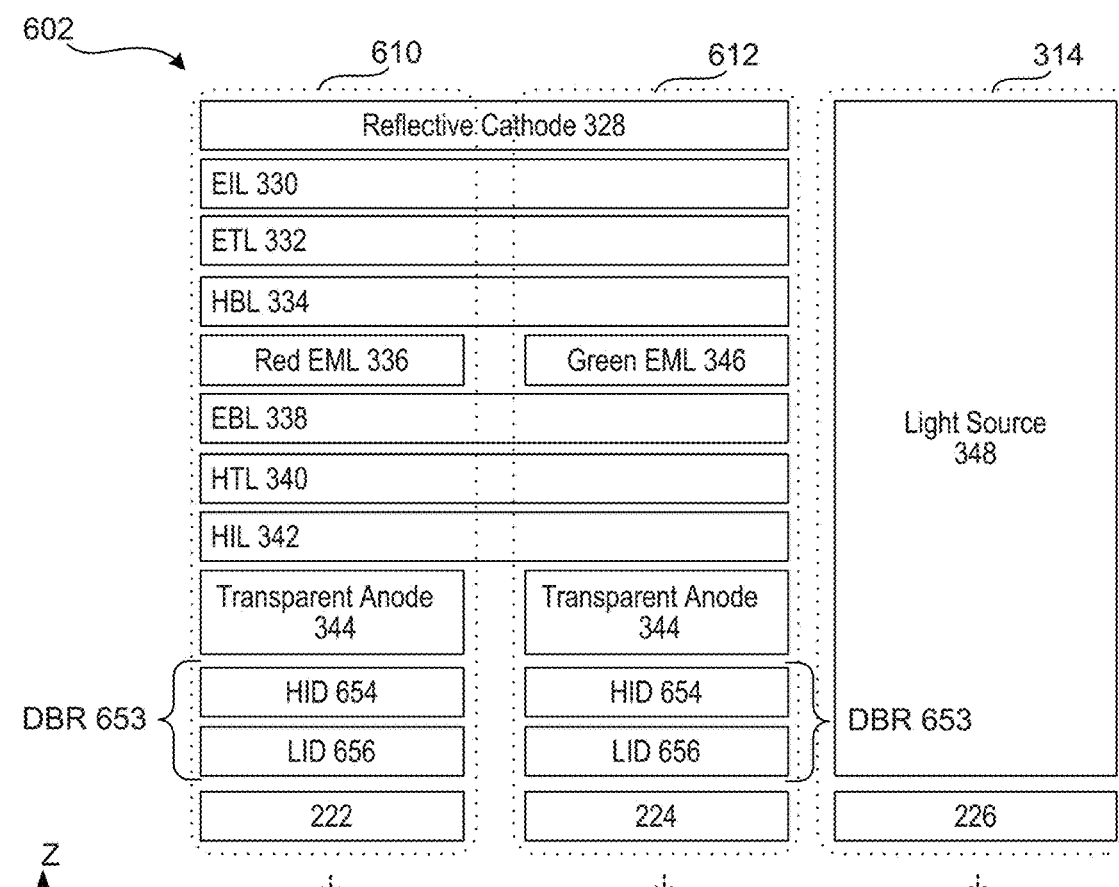

FIG. 6 illustrates an exploded cross-sectional view of a tri-chromatic pixel 602 of a bottom emission LED display device. The discussion of pixel 502 applies to pixel 602 unless mentioned otherwise. Pixel 602 can include red, green, and blue sub-pixels 610, 612, and 314. Red and green sub-pixels 610 and 612 can be similar to red and green sub-pixels 510 and 512, respectively, except that red and green sub-pixels 610 and 612 include distributed Bragg reflectors (DBRs) 653 positioned between transparent anode 344 and substrate 222 and between transparent anode 344 and substrate 224, respectively.

DBRs 653 can be configured to provide a partially reflective surface and form optical cavities between reflective cathode 328 and DBRs 653. The optical cavities may allow photons released from EMLs 336 and 346 to be reflected back and forth between reflective cathodes 328 and DBRs 653 before being emitted out of pixel 602 through substrates 222 and 224. The back and forth reflection of the photons may facilitate constructive interference of the photons at a particular wavelength and consequently, output narrower red and green emission spectrum from red and green sub-pixels 610 and 612, respectively. In some embodiments, each of DBRs 653 can include one or more pairs of high index dielectric (HID) layer 654 (e.g., titanium oxide) and low index dielectric (LID) layer 656 (e.g., silicon oxide).

Figure 7:
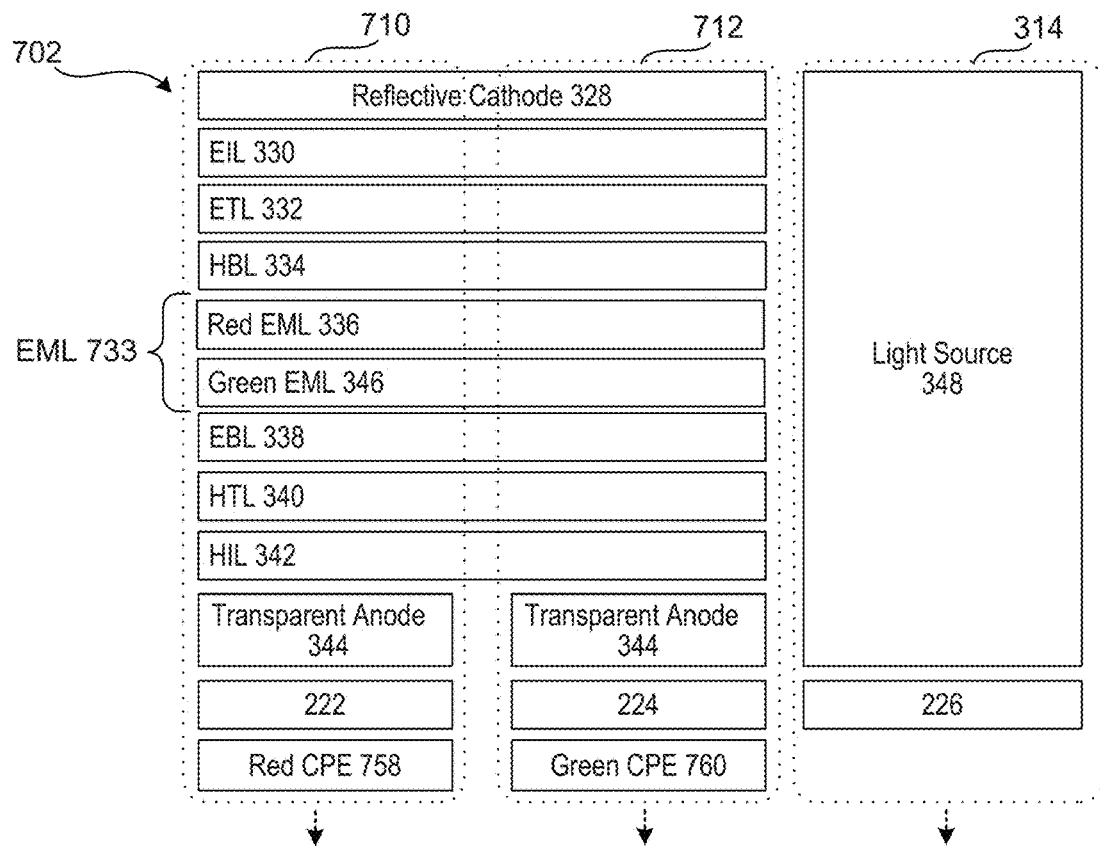

FIG. 7 illustrates an exploded cross-sectional view of a tri-chromatic pixel 702 of a bottom emission LED display device. The discussion of pixel 502 applies to pixel 702 unless mentioned otherwise. Pixel 702 can include red, green, and blue sub-pixels 710, 712, and 314. Red and green sub-pixels 710 and 712 can be similar to red and green sub-pixels 510 and 512, respectively, except that each of EMLs 336 and 346 can be shared between red and green sub-pixels 710 and 712 and not be separate layers as in FIG. 5. Also, compared to pixel 502, pixel 702 can have red and green CPE 758 and 760 under substrate 222 and 224, respectively.

As a portion of green EML 346 is included in red sub-pixel 710, red CPE 758 can be configured to filter out green light that may travel from EML 346 and pass through substrate 222. Similarly, as a portion of red EML 336 is included in green sub-pixel 712, green CPE 760 can be configured to filter out red light that may travel from EML 336 and pass through substrate 224. Each of CPEs 758 and 760 can have one or more non-phosphor films that exclude luminescent nanostructures such as QDs (e.g., NS 1700 described with reference to FIG. 17) and have color filtering properties to filter out one or more selective wavelengths or range of wavelengths in the green and red wavelength regions of the visible spectrum, respectively.

The stacking order of EMLs 336 and 346 in EML stack 733 can be such that light emitted from one EML is not substantially absorbed by the other EML in EML stack 733. As EML 346 that produces green light has wider energy bandgap material than the material of EML 336 that produces red light, EML 336 can be placed on EML 346. The energy bandgap of EML 346's material is wide enough that energy from red light of EML 336 does not excite electrons of EML's 346 material across the energy bandgap to the conduction band and cause absorption of the red light. So, the red light from EML 336 can pass through EML 346 towards substrate 222.

In some embodiments, similar to pixel 702, pixels 302, 402, and 602 can have EML stack 733 and CPEs 758 and 760 instead of their separate EMLs 336 and 346.

Figure 8:
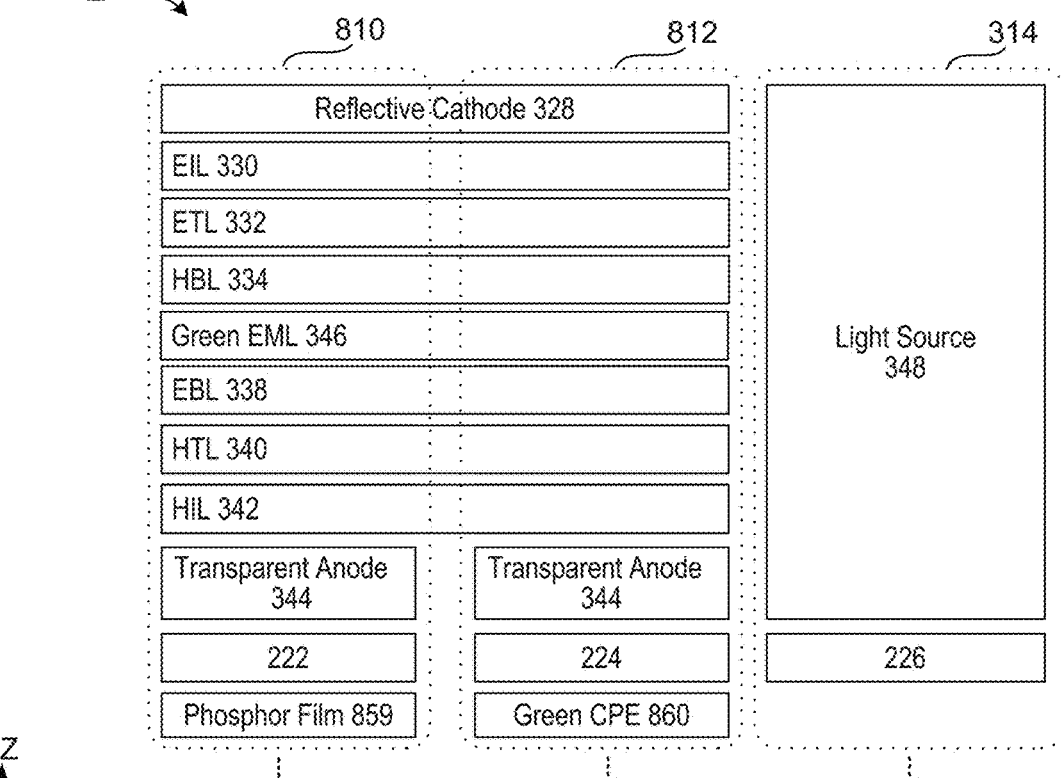

FIG. 8 illustrates an exploded cross-sectional view of a tri-chromatic pixel 802 of a bottom emission LED display device. The discussion of pixel 702 applies to pixel 802 unless mentioned otherwise. Pixel 802 can include red, green, and blue sub-pixels 810, 812, and 314. Red and green sub-pixels 810 and 812 can be similar to red and green sub-pixels 710 and 712, respectively, except that red and green sub-pixels 810 and 812 can have one or more EMLs 346 but does not have EML 336. In addition, compared to pixel 702, pixel 802 can have a phosphor film 859 (e.g., NS film 1800 described with reference to FIG. 18) instead of CPE 758 and CPE 860 instead of CPE 760.

As red sub-pixel 810 does not have EML 336 to produce the red light, phosphor film 859 can be configured to produce the red light by down converting a portion of green light produced by EML 346 and emitted through substrate 222. CPE 860 can be an optically transparent element or may have one or more non-phosphor films that exclude luminescent nanostructures such as QDs (e.g., NS 1700 described with reference to FIG. 17) and have color filtering properties to filter out one or more selective wavelengths or range of wavelengths in the green wavelength regions of the visible spectrum. In some embodiments phosphor film 859 and CPE 860 can be placed between EML 346 and EBL 338, between EBL 338 and HTL 340, between HTL 340 and HIL 342, between HIL 342 and anodes 344, or between anodes and respective substrates 222 and 224.

Figure 9:
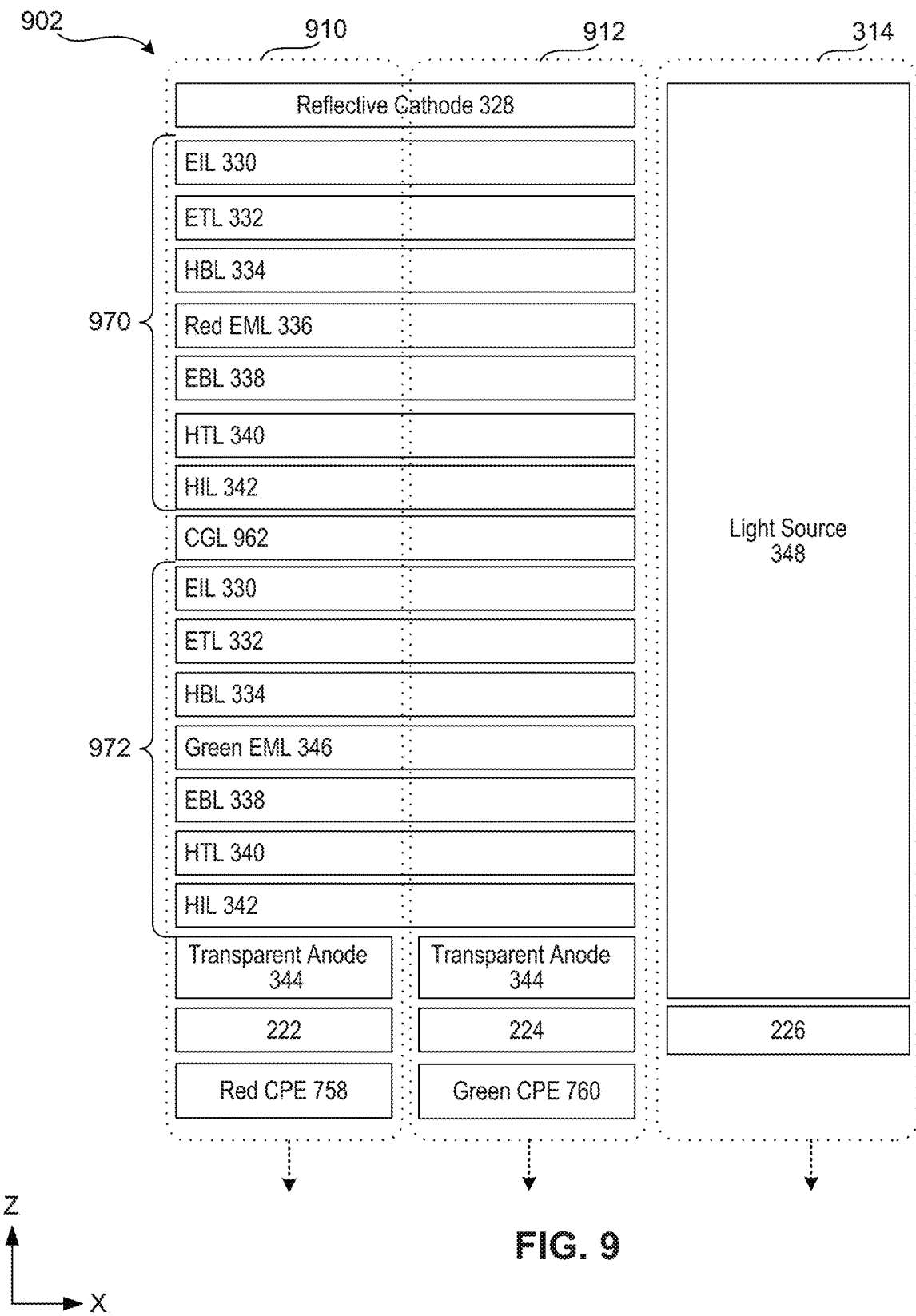

FIG. 9 illustrates an exploded cross-sectional view of a tri-chromatic pixel 902 of a bottom emission LED display device. The discussion of pixel 302 applies to pixel 902 unless mentioned otherwise. Pixel 902 can include red, green, and blue sub-pixels 910, 912, and 314. In pixel 902, a first stack 970 of EIL 330, ETL 332, HBLs 334, EML 336, EBL 338, HTL 340, and HIL 342 can be formed on a second stack 972 of EIL 330, ETL 332, HBLs 334, EML 346, EBL 338, HTL 340, and HIL 342 instead of being formed adjacent to the second stack 972 as in pixel 302. Also, compared to pixel 302, pixel 902 can have red and green CPE 758 and 760 under substrate 222 and 224, respectively. Similar to pixel 702, red CPE 758 can be configured to filter out green light that may pass through substrate 222 and green CPE 760 can be configured to filter out red light that may pass through substrate 224. In some embodiments, red CPE 758 can be replaced with phosphor film 859.

The stacking order of first and second stacks 970 and 972 can be such that light emitted from one stack is not substantially absorbed by the other stack in pixel 902. The reason for such stacking order may be similar to that described above with respect to EML stack 733 in FIG. 7. In some embodiments, first stack 970 can be formed directly on second stack 972 or there may be an intervening charge generation layer (CGL) 962 between first and second stacks 970 and 972.

CGL 962 can be configured to provide holes to the first stack and electrons to the second stack. In some embodiments, CGL 962 can include a pair of layers. A first layer of the pair of layers may be configured to provide the electrons and may include alkali metal salts such as LiF, low work function metals such as Ca, Ba, and n-doped material. A second layer of the pair of layers may be configured to provide the holes and may include arylamine based hole transport host and electron accepting dopant (e.g. charge transfer salts), strongly electron accepting small organic molecules, and/or metal oxides. CGL 962 can be formed by, for example, spin coating, inkjet printing, slot die coating, nozzle printing, contact printing, a suitable solution printing technology, thermal evaporation, or a suitable vapor deposition technology.

In some embodiments, CPEs 758 and 760 of FIGS. 7 and 9 can be placed between EML 346 and EBL 338, between EBL 338 and HTL 340, between HTL 340 and HIL 342, between HIL 342 and anodes 344, or between anodes and respective substrates 222 and 224.

In some embodiments, each of pixels 502-902 can have a blue sub-pixel similar to blue sub-pixel 414 of FIG. 4 instead of blue sub-pixel 314.

In some embodiments, each of pixels 302-502 and 702-902 (FIGS. 3-4 and 6-9) can have DBRs between transparent anode 344 and substrate 222 and between transparent anode 344 and substrate 224 similar to DBRs 653 of FIG. 6.

In some embodiments, red and green sub-pixels of pixels 302-902 of respective FIGS. 3-9 can have inverted structures with respect to the structures illustrated in FIGS. 3-9. The inverted structures can have the same direction of light emission as the structures illustrated in FIGS. 3-9. In the inverted structures, the stacking order of EIL 330, ETL 332, HBL 334, EBL 338, HTL 340, and HIL 342 can be reversed with respect to the stacking order of these layers in FIGS. 3-9. For example, HIL 342 can be over HTL 340, HTL 340 can be over EBL 338, EBL 338 can be over HBL 334, HBL 334 can be over ETL 332, and ETL 332 can be over EIL 330 in these inverted structures.

In addition, reflective cathodes 328 can be replaced by reflective anodes and transparent anodes 344 can be replaced by transparent cathodes in these inverted structures. Similar to reflective cathodes 328, reflective anodes of these inverted structures can include electrically conductive and optically reflective materials such as, for example, aluminum (Al) or silver (Ag), according to some embodiments. Similar to transparent anodes 344, transparent cathodes of these inverted structures can include electrically conductive and optically transparent materials such as, for example, indium-tin-oxide (ITO), according to some embodiments.

Figure 10:
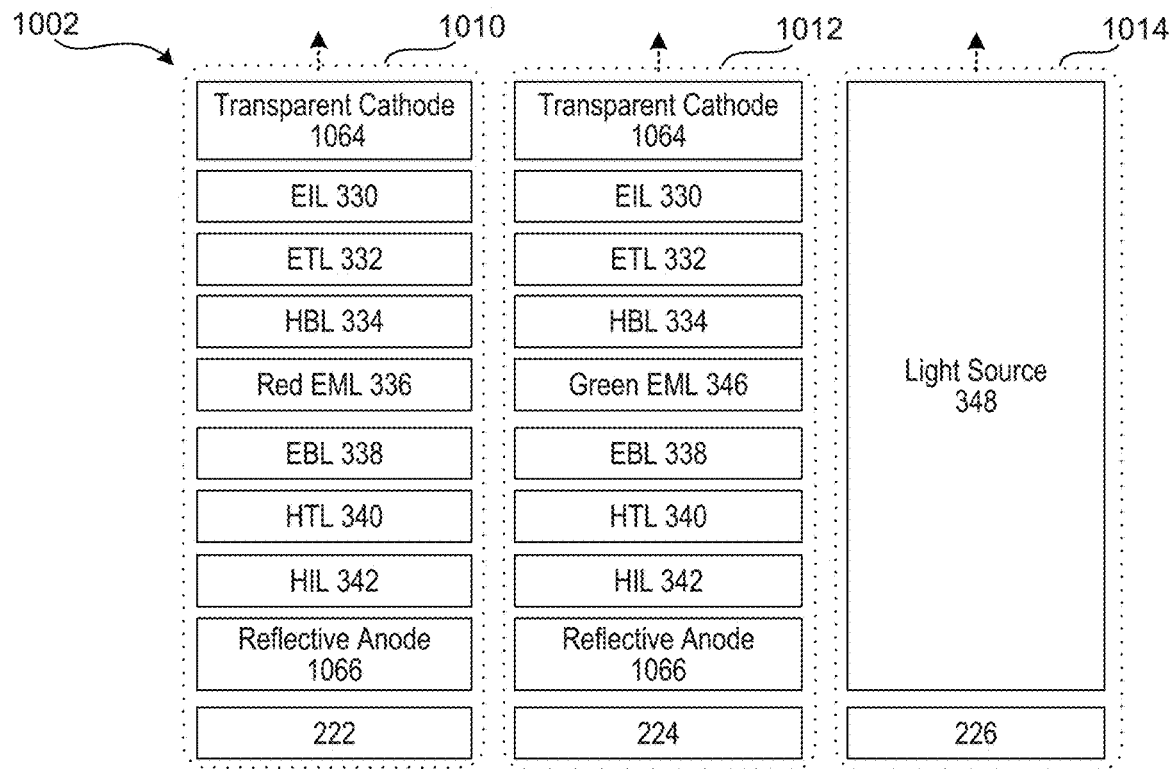
FIGS. 10-16 are cross-sectional views of pixels of top emission LED display devices, according to some embodiments.
Figure 11:
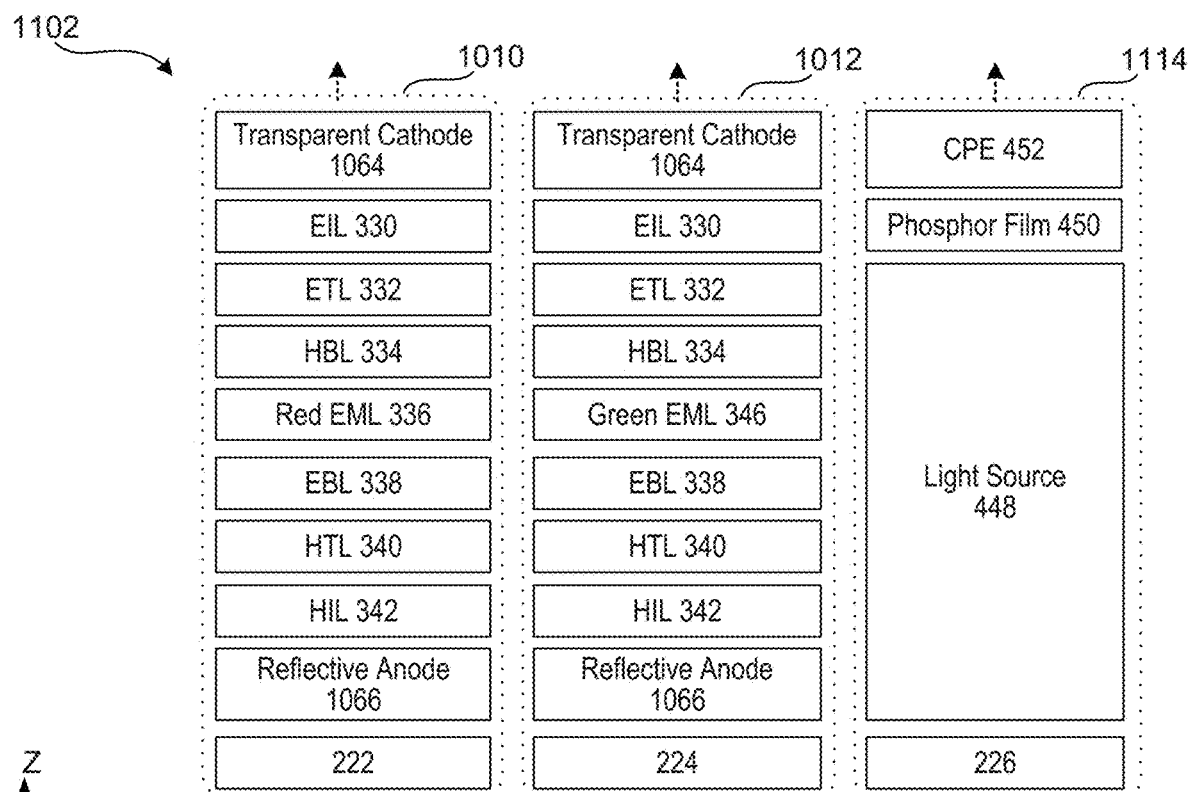
Figure 12:
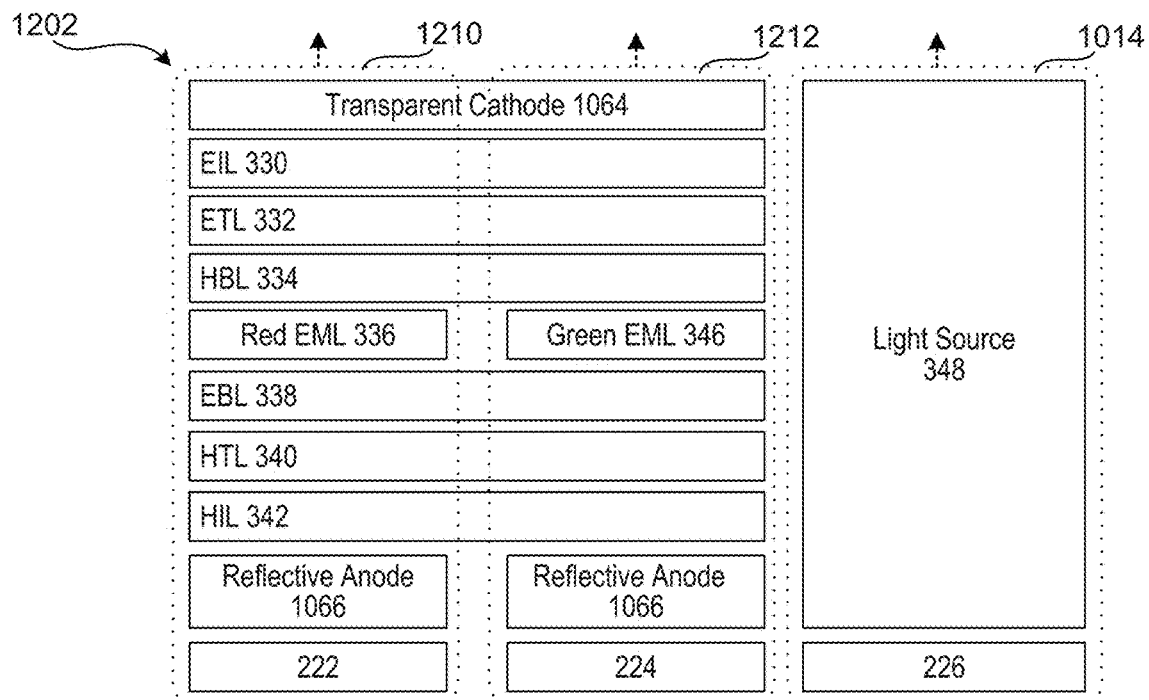

FIGS. 10-12 illustrate exploded cross-sectional views of tri-chromatic pixels 1002-1202, respectively, of top emission LED display devices. Pixels 1002, 1102, and 1202 can be similar to pixels 302, 402, and 502, respectively, except for the differences discussed below. Pixels 1002 and 1102 can include similar red and green sub-pixels 1010 and 1012, but different blue sub-pixels 1014 and 1114, respectively. Pixel 1210 can include red, green, and blue sub-pixels 1210, 1212, and 1014.

Pixels 1002-1202 have transparent cathodes 1064 and reflective anodes 1066 instead of reflective cathodes 328 and transparent anodes 344 as in pixels 302-502. Similar to cathodes 328 and anodes 344, cathodes 1064 and anodes 1066 can be configured to inject electrons and holes, respectively, into the stacks of red and green sub-pixels to produce red and green light. However, as red and green light is emitted through cathodes 1064 in these top emission display devices, cathodes 1064 can include optically transparent material. In addition, reflective anodes 1066 can include optically reflective material for increased light output efficiency and to prevent red and green light from leaking through substrates 222 and 224, respectively.

In some embodiments, cathodes 1064 can include electrically conductive and optically transparent layers such as, for example, a layer of ITO, a multilayer stack of ITO/Ag/ITO, or a thin layer of Ag having a thickness of about 10 nm. In some embodiments, anodes 1066 can include electrically conductive and optically reflective layers such as, for example, Al or Ag. In some embodiments, anodes 1066 can include a non-reflective electrically conductive layer (e.g., ITO) and a reflective layer (e.g., Ag or Al). The reflective layer may be formed directly on substrates 222 and 224.

Blue sub-pixels 1014 and 1114 of pixels 1002-1202 can be similar to blue sub-pixels 314 and 414, respectively, except that light sources 348 and 448 can be placed on substrates 226 in a manner such that light is emitted from top of the display device and not through substrate 226. In addition, phosphor film 450 and blue CPE 452 of blue sub-pixel 1114 can be placed on emitting side of light source 448 such that violet or UV light from light source 448 is down converted and filtered to blue light and emitted from top of the display device.

Figure 13:
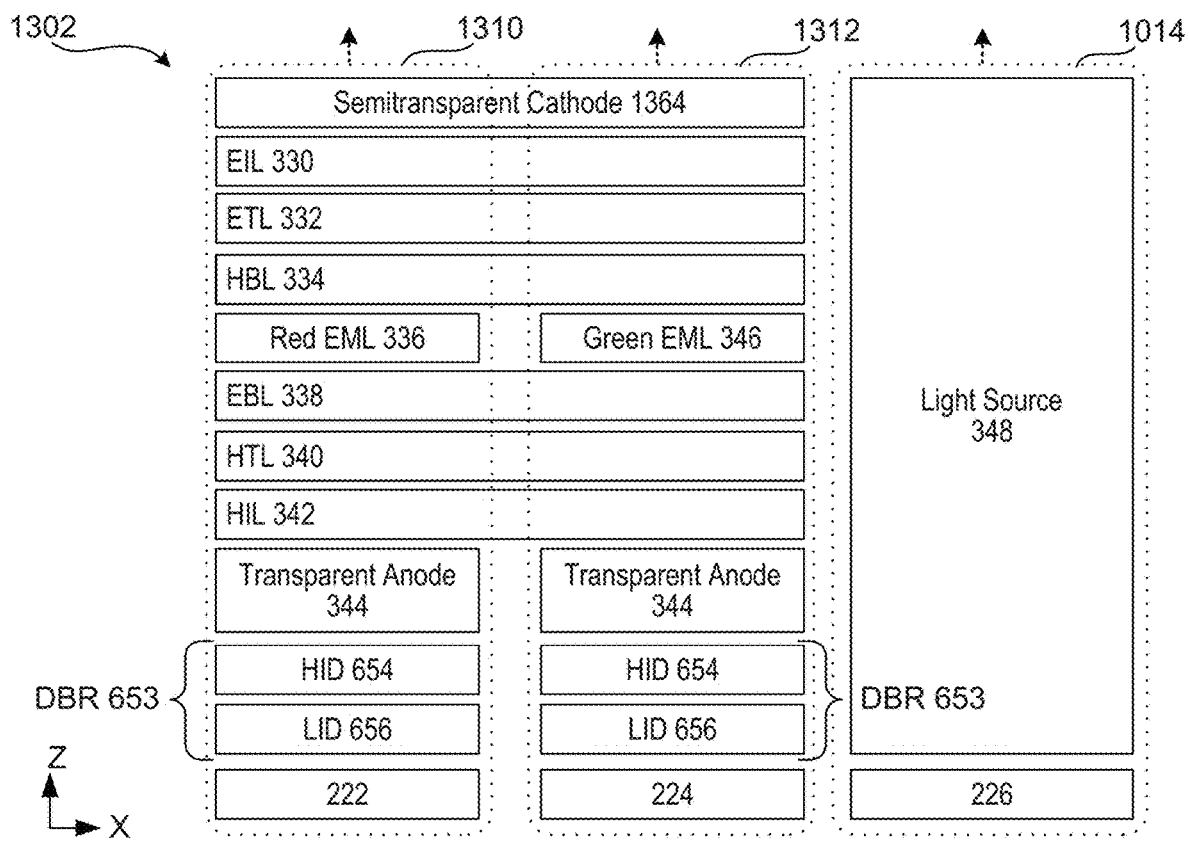

FIG. 13 illustrates an exploded cross-sectional view of a tri-chromatic pixel 1302 of a top emission LED display device. Pixel 1302 can be similar to pixel 602 except for the differences discussed below. Pixel 1302 can include red, green, and blue sub-pixels 1310, 1312, and 1014. Red and green sub-pixels 1310 and 1312 can share a cathode 1364 that is partially transparent to red and green light emitted from sub-pixels 1310 and 1312, respectively. The partially transparent property of cathode 1364 can allow optical cavities to be formed between cathode 1364 and DBRs 653, similar to that discussed with reference to FIG. 6. The optical cavities may allow red and green light produced by EMLs 336 and 346 to be reflected back and forth between partially transparent cathodes 1064 and DBRs 653 before being emitted out of pixel 1302.

Figure 14:
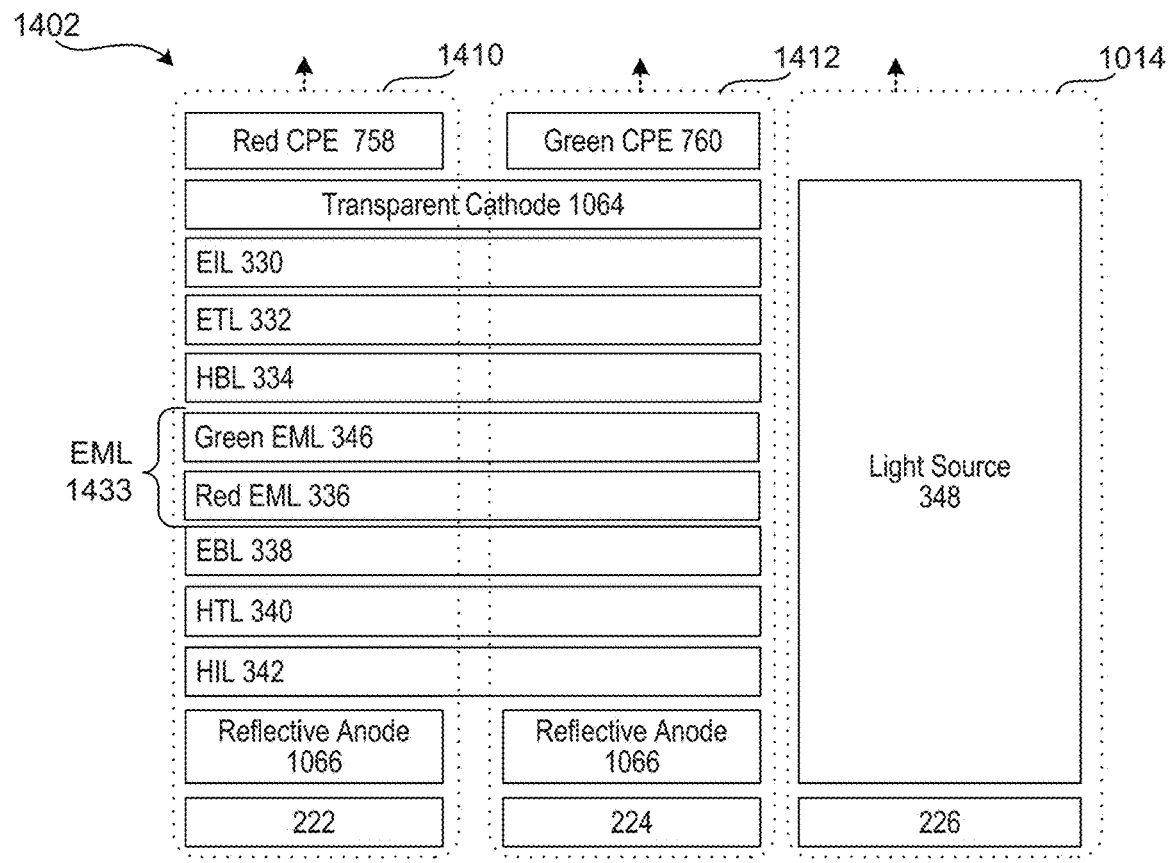

FIG. 14 illustrates an exploded cross-sectional view of a tri-chromatic pixel 1402 of a top emission LED display device. The discussion of pixel 1202 applies to pixel 1402 unless mentioned otherwise. Pixel 1402 can include red, green, and blue sub-pixels 1410, 1412, and 1014. EMLs 336 and 346 of pixel 1402 can be shared between red and green sub-pixels 1410 and 1412 and not be separate layers as in FIG. 12. Also, compared to pixels 702 and 1202, pixel 1402 can have red and green CPEs 758 and 760 on cathode 1064.

As a portion of green EML 346 is included in red sub-pixel 1410, red CPE 758 can be configured to filter out green light that may travel from EML 346 and pass through cathode 1064. Similarly, as a portion of red EML 336 is included in green sub-pixel 1412, green CPE 760 can be configured to filter out red light that may travel from EML 336 and pass through cathode 1064. Similar to EML 733, the stacking order of EMLs 336 and 346 in EML stack 1433 can be such that red light emitted from EML 336 is not substantially absorbed by EML 346. As such, EML 346 can be placed on EML 336 so that the red light from EML 336 can pass through EML 346 towards cathode 1064. In some embodiments, similar to pixel 1402, pixels 1002, 1102, and 1302 can have EML stack 1433 and CPEs 758 and 760 instead of their separate EMLs 336 and 346.

Figure 15:
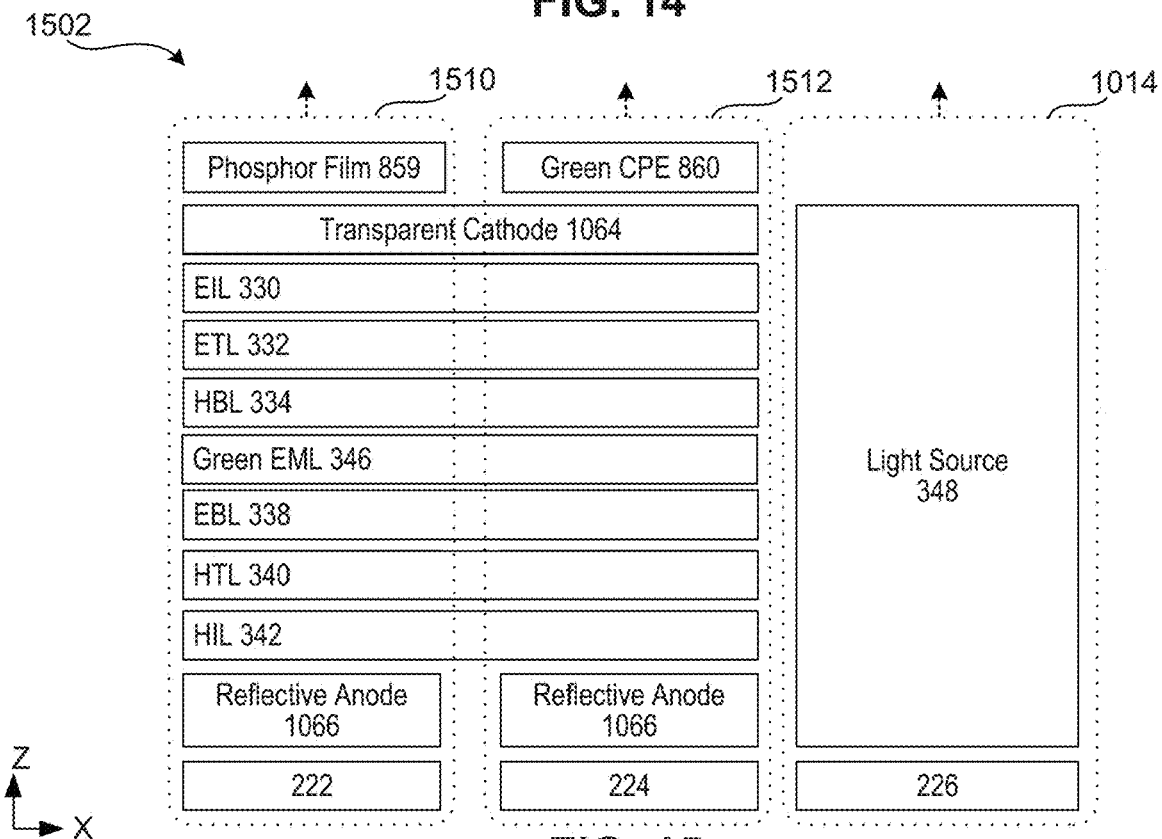

FIG. 15 illustrates an exploded cross-sectional view of a tri-chromatic pixel 1502 of a top emission LED display device. The discussion of pixel 1402 applies to pixel 1502 unless mentioned otherwise. Pixel 1502 can include red, green, and blue sub-pixels 1510, 1512, and 1514. Pixel 1502 can have one or more EMLs 346 but does not have EML 336. In addition, compared to pixels 802 and 1402, pixel 1502 can have phosphor film 859 and CPE 860 on cathode 1064.

As red sub-pixel 1510 does not have EML 336 to produce the red light, phosphor film 859 can be configured to produce the red light by down converting a portion of green light produced by EML 346 and emitted through cathode 1064. In some embodiments phosphor film 859 and CPE 860 can be placed between EML 346 and HBL 334, between HBL 334 and ETL 332, between ETL 332 and EIL 330, or between EIL 330 and cathode 1064.

Figure 16:
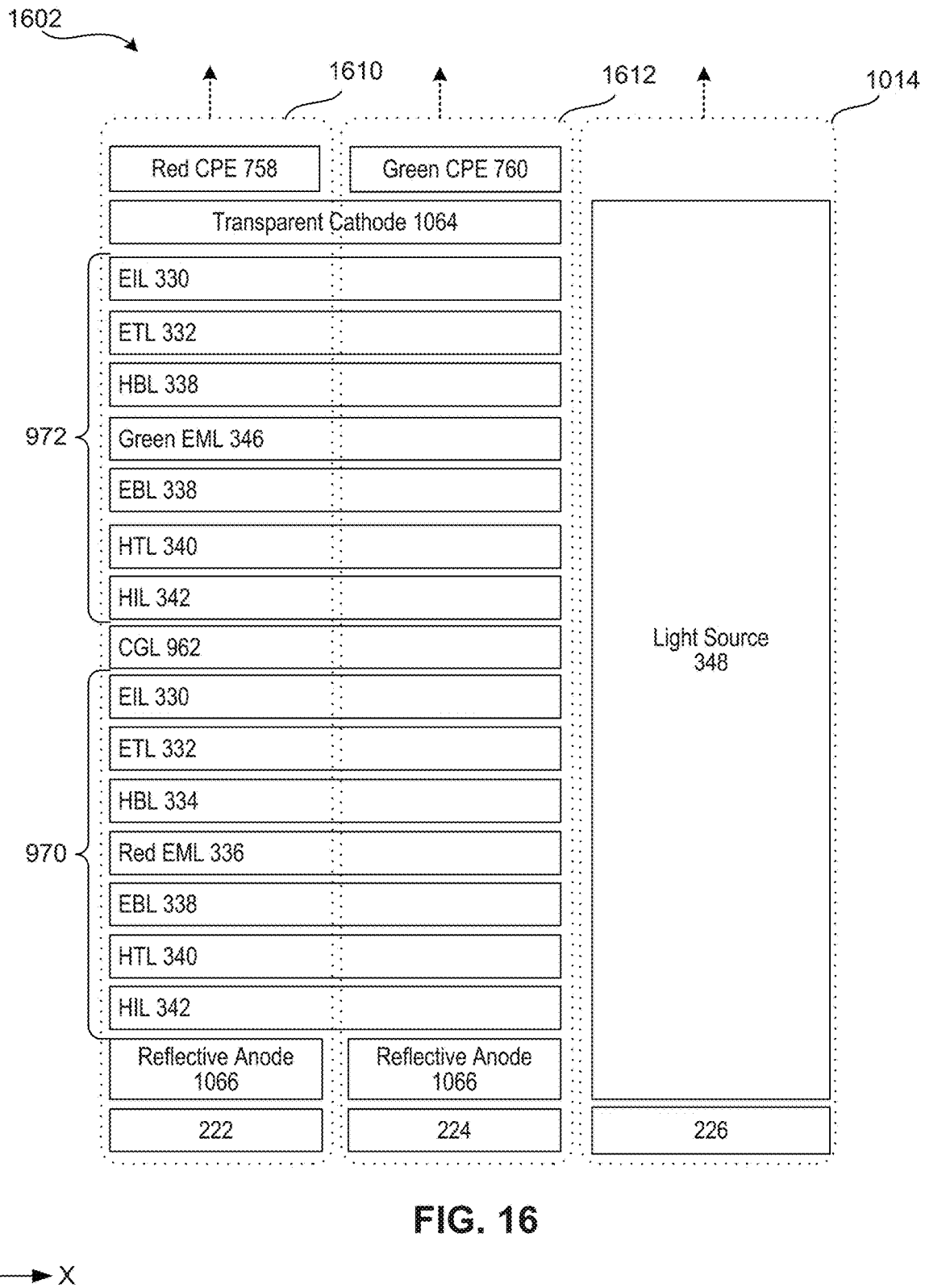

FIG. 16 illustrates an exploded cross-sectional view of a tri-chromatic pixel 1602 of a top emission LED display device. The discussion of pixel 1002 applies to pixel 1602 unless mentioned otherwise. Pixel 1602 can include red, green, and blue sub-pixels 1610, 1612, and 1014. In pixel 1602, first stack 970 can be formed on anodes 1066 and second stack 972 can be formed on first stack 970 instead of being formed adjacent to first stack 970 as in pixel 1002. Also, compared to pixel 1002, pixel 1602 can have red and green CPE 758 and 760. Similar to pixel 1402, red CPE 758 can be configured to filter out green light that may pass through cathode 1064 and green CPE 760 can be configured to filter out red light that may pass through cathode 1064. In some embodiments, red CPE 758 can be replaced with phosphor film 859.

The stacking order of first and second stacks 970 and 972 can be such that light emitted from one stack is not substantially absorbed by the other stack in pixel 1602. The reason for such stacking order may be similar to that described above with respect to EML stack 1433 in FIG. 14. In some embodiments, second stack 972 can be formed directly on first stack 970 or there may be an intervening charge generation layer (CGL) 962 between the first and second stacks.

In some embodiments, CPEs 758 and 760 of FIGS. 14 and 16 can be placed between EML 346 and HBL 334, between HBL 334 and ETL 332, between ETL 332 and EIL 330, between EIL 330 and cathode 1064.

In some embodiments, each of pixels 1202-1602 can have a blue sub-pixel similar to blue sub-pixel 1114 of FIG. 11 instead of blue sub-pixel 1014.

In some embodiments, similar to pixel 602, each of pixels 1002-1202 and 1402-1602 (FIGS. 10-12 and 14-16) may have DBRs 653 and transparent anodes 344 and semitransparent cathode 1364 instead of anode 1066 and cathode 1064, respectively. In some embodiments, each of pixels 1002-1202 and 1402-1602 (FIGS. 10-12 and 14-16) may have semitransparent cathode 1364 instead of cathode 1064, respectively.

In some embodiments, red and green sub-pixels of pixels 1002-1002 of respective FIGS. 10-16 can have inverted structures with respect to the structures illustrated in FIGS. 10-16. The inverted structures can have the same direction of light emission as the structures illustrated in FIGS. 10-16. In the inverted structures, the stacking order of EIL 330, ETL 332, HBL 334, EBL 338, HTL 340, and HIL 342 can be reversed with respect to the stacking order of these layers in FIGS. 10-16. For example, HIL 342 can be over HTL 340, HTL 340 can be over EBL 338, EBL 338 can be over HBL 334, HBL 334 can be over ETL 332, and ETL 332 can be over EIL 330 in these inverted structures.

In addition, transparent cathodes 1064 can be replaced by transparent anodes, semitransparent cathode 1364 can be replaced by semitransparent anode, transparent anode 344 can be replaced by transparent cathode, and reflective anodes 1066 can be replaced by reflective cathodes in these inverted structures. Similar to transparent cathodes 1064, transparent anodes of these inverted structures can include electrically conductive and optically transparent layers such as, for example, a layer of ITO, a multilayer stack of ITO/Ag/ITO, or a thin layer of Ag having a thickness of about 10 nm, according to some embodiments. Similar to reflective anodes 1066, reflective cathodes of these inverted structures can include a non-reflective electrically conductive layer (e.g., ITO) and a reflective layer (e.g., Ag or Al), according to some embodiments.

Example Embodiments of a Barrier Layer Coated Nanostructure

Figure 17:
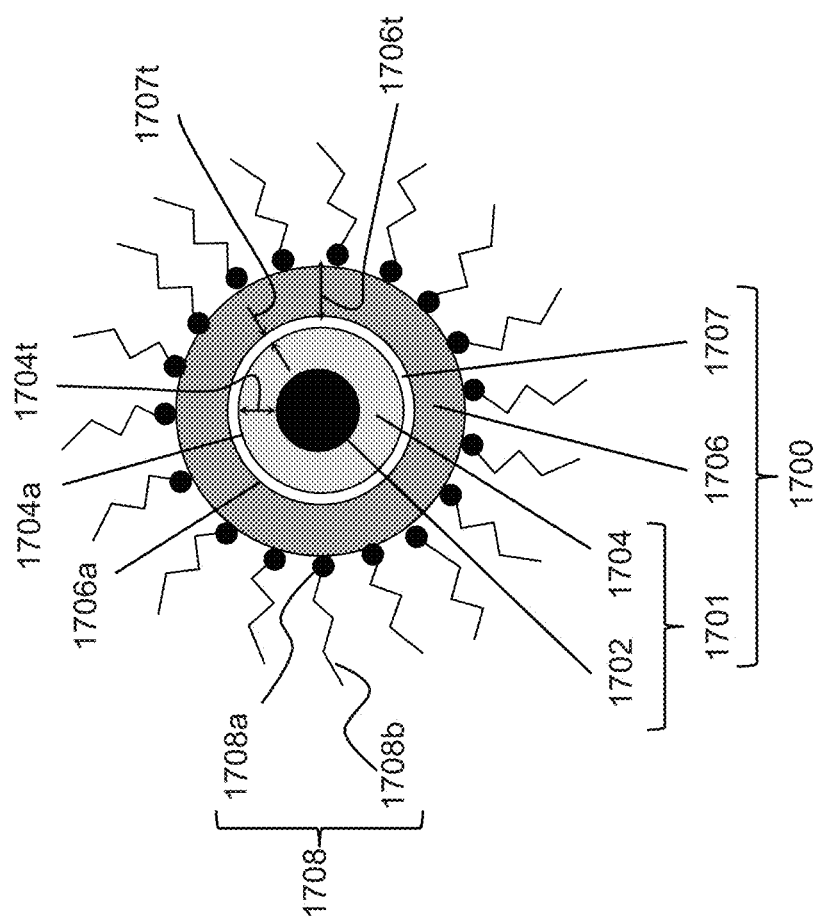
FIG. 17 is a schematic of a cross-sectional view of a nanostructure (NS), according to some embodiments.

FIG. 17 illustrates a cross-sectional structure of a barrier layer coated luminescent nanostructure (NS) 1700, according to an embodiment. In some embodiments, a population of NS 1700 can be included in phosphor films of EMLs 336, 346, 450, and/or 859. Barrier layer coated NS 1700 includes a NS 1701 and a barrier layer 1706. NS 1701 includes a core 1702 and a shell 1704. Core 1702 includes a semiconducting material that emits light. Examples of the semiconducting material for core 1702 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap may be used as well. In an embodiment, core 1702 can also include one or more dopants such as metals, halogens, and alloys, to provide some examples. Examples of metal dopant may include, but not limited to, zinc (Zn), Copper (Cu), aluminum (Al), platinum (Pt), chrome (Cr), tungsten (W), palladium (Pd), or a combination thereof. Examples of a halogen dopant may include, but are not limited to, fluorine (F), chlorine (Cl), bromine (Br) or iodine (I). The presence of one or more dopants in core 1702 can improve structural, electrical, and/or optical stability and QY of NS 1701 compared to undoped NSs.

Core 1702 can have a size of less than 20 nm in diameter, according to an embodiment. In another embodiment, core 1702 can have a size between about 1 nm and about 10 nm in diameter. The ability to tailor the size of core 1702, and consequently the size of NS 1701 in the nanometer range enables photoemission coverage in the entire optical spectrum. In general, the larger NSs emit light towards the red end of the spectrum, while smaller NSs emit light towards the blue end of the spectrum. This effect arises as larger NSs have energy levels that are more closely spaced than the smaller NSs. This allows the NS to absorb photons containing less energy, i.e. those closer to the red end of the spectrum.

Shell 1704 surrounds core 1702 and is disposed on outer surface of core 1702. Shell 1704 can include, but is not limited to, cadmium sulfide (CdS), zinc cadmium sulfide (ZnCdS), zinc selenide sulfide (ZnSeS), and zinc sulfide (ZnS). In an embodiment, shell 1704 can have a thickness 1704t, for example, one or more monolayers. In other embodiments, shell 1704 can have a thickness 1704t between about 1 nm and about 10 nm. Shell 1704 can be utilized to help reduce the lattice mismatch with core 1702 and improve the QY of NS 1701. Shell 1704 can also help to passivate and remove surface trap states, such as dangling bonds, on core 1702 to increase QY of NS 1701. The presence of surface trap states may provide non-radiative recombination centers and contribute to lowered emission efficiency of NS 1701.

In alternate embodiments, NS 1701 may include a second shell disposed on shell 1704, or more than two shells surrounding core 1702, without departing from the spirit and scope of the present invention. In an embodiment, the second shell may be one or more monolayers thick and is typically, though not required, also a semiconducting material. Second shell may provide protection to core 1702. Second shell material may be zinc sulfide (ZnS), although other materials may be used, and dopants can be included as well, without deviating from the scope or spirit of the invention.

Barrier layer 1706 is configured to form a coating on NS 1701. In an embodiment, barrier layer 1706 is disposed on and in substantial contact with outer surface 1704a of shell 1704. In embodiments of NS 1701 having one or more shells, barrier layer 1706 can be disposed on and in substantial contact with the outermost shell of NS 1701. In an example embodiment, barrier layer 1706 is configured to act as a spacer between NS 1701 and one or more NSs in, for example, a solution, a composition, and/or a film having a plurality of NSs, where the plurality of NSs may be similar to NS 1701 and/or barrier layer coated NS 1700. In such NS solutions, NS compositions, and/or NS films, barrier layer 1706 can help to prevent aggregation of NS 1701 with adjacent NSs. Aggregation of NS 1701 with adjacent NSs may lead to increase in size of NS 1701 and consequent reduction or quenching in the optical emission properties of the aggregated NS (not shown) including NS 1701. In further embodiments, barrier layer 1706 provides protection to NS 1701 from, for example, moisture, air, and/or harsh environments (e.g., high temperatures and chemicals used during lithographic processing of NSs and/or during manufacturing process of NS based devices) that may adversely affect the structural and optical properties of NS 1701.

Barrier layer 1706 can include one or more materials that are amorphous, optically transparent and/or electrically inactive. Suitable barrier layers include inorganic materials, such as, but not limited to, inorganic oxides, halides, and/or nitrides. Examples of materials for barrier layer 1706 include oxides and/or nitrides of Al, Ba, Ca, Mg, Ni, Si, Ti, or Zr, according to various embodiments. Barrier layer 1706 can have a thickness 1706*t* ranging from about 0.5 nm to about 15 nm in various embodiments.

Barrier layer coated NS 1700 may additionally or optionally include a buffer layer 1707 configured to form a buffered coating on NS 1701. In an embodiment, buffer layer 107 is disposed on shell 1704 and in substantial contact with outer surface 1704*a* of shell 1704 and inner surface 1706*a* of barrier layer 1706. Buffer layer 107 may be configured to act as a buffer between NS 1701 and chemicals used during subsequent processing on NS 1701, such as, for example, formation of barrier layer 1706 on NS 1701.

Buffer layer 107 may help to substantially reduce and/or prevent quenching in the optical emission properties of NS 1701 due to reaction with chemicals used during subsequent processing on NS 1701. Buffer layer 1707 may include one or more materials that are amorphous, optically transparent and/or electrically active. The one or more materials of buffer layer 1707 may include inorganic or organic materials. Examples of inorganic materials for buffer layer 1707 include oxides and/or nitrides of metals, according to various embodiments. Examples for metal oxides include ZnO, $TiO_2$, $In_2O_3$, $Ga_2O_3$, $SnO_2$, $Al_2O_3$, or MgO. Buffer layer 1707 may have a thickness 1707*t* ranging from about 1 nm to about 5 nm in various embodiments.

As illustrated in FIG. 17, barrier layer coated NS 1700 can additionally or optionally include a plurality of ligands or surfactants 1708, according to an embodiment. Ligands or surfactants 1708 can be adsorbed or bound to an outer surface of barrier layer coated NS 1700, such as on an outer surface of barrier layer 1706, or outer surface of shell 1704 or second shell, according to an embodiment. The plurality of ligands or surfactants 1708 can include hydrophilic or polar heads 1708*a* and hydrophobic or non-polar tails 1708*b*. The hydrophilic or polar heads 1708*a* may be bound to barrier layer 1706. The presence of ligands or surfactants 1708 can help to separate NS 1700 and/or NS 1701 from other NSs in, for example, a solution, a composition, and/or a film during their formation. If the NSs are allowed to aggregate during their formation, the quantum efficiency of NSs such as NS 1700 and/or NS 1701 may drop. Ligands or surfactants 1708 can also be used to impart certain properties to barrier layer coated NS 1700, such as hydrophobicity to provide miscibility in non-polar solvents, or to provide reaction sites (e.g., reverse micellar systems) for other compounds to bind.

A wide variety of ligands exist that may be used as ligands 1708. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is a thiol, for example, octanethiol. In some embodiments, the ligand is diphenylphosphine. In some embodiments, the ligand is a neutral salt of any of these fatty acids, or a chalcogenide of any of these amines, phosphines, or phosphine oxides, for example, zinc oleate, zinc laurate, TOP-selenide, or TOP-sulfide.

A wide variety of surfactants exist that may be used as surfactants 1708. Nonionic surfactants may be used as surfactants 1708 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants may be used as surfactants 1708 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, NSs 1701 and/or 1700 can be synthesized to emit light in one or more various color ranges, such as red, orange, and/or yellow range. In some embodiments, NSs 1701 and/or 1700 can be synthesized to emit light in the green and/or yellow range. In some embodiments, NSs 1701 and/or 1700 can be synthesized emit light in the blue, indigo, violet, and/or ultra-violet range. In some embodiments, NSs 1701 and/or 1700 can be synthesized to have a primary emission peak wavelength between about 605 nm and about 650 nm, between about 510 nm and about 550 nm, or between about 300 nm and about 495 nm.

NSs 1701 and/or 1700 can be synthesized to display a high QY. In some embodiments, NSs 1701 and/or 1700 can be synthesized to display a QY between 80% and 100% or between 85% and 90%.

Thus, according to various embodiments, NSs 1700 can be synthesized such that the presence of barrier layer 1706 on NSs 1701 does not substantially change or quench the optical emission properties of NSs 1701.

Example Embodiments of a Nanostructure Film

Figure 18:
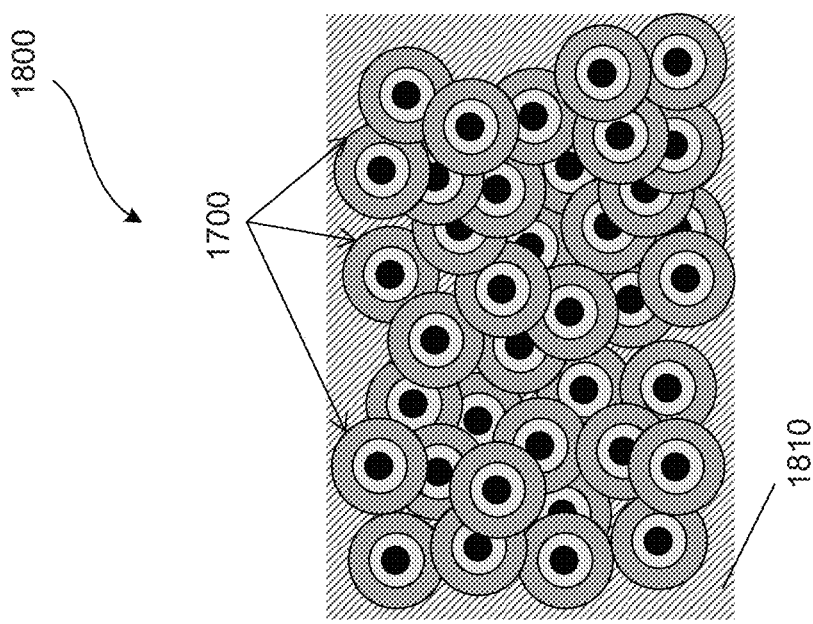
FIG. 18 is a schematic of a NS film, according to some embodiments.

FIG. 18 illustrates a cross-sectional view of a NS film 1800, according to an embodiment. In some embodiments, phosphor films of EMLs 336, 346, 450, and/or 859 can be similar to NS film 1800.

NS film 1800 can include a plurality of barrier layer coated core-shell NSs 1700 (FIG. 17) and a matrix material 1810, according to an embodiment. NSs 1700 can be embedded or otherwise disposed in matrix material 1810, according to some embodiments. As used herein, the term "embedded" is used to indicate that the NSs are enclosed or encased within matrix material 1810. It should be noted that NSs 1700 can be uniformly distributed throughout matrix material 1810 in an embodiment, though in other embodiments NSs 1700 can be distributed according to an application-specific uniformity distribution function. It should be noted that even though NSs 1700 are shown to have the same size in diameter, a person skilled in the art would understand that NSs 1700 can have a size distribution.

In an embodiment, NSs 1700 can include a homogenous population of NSs having sizes that emit in the blue visible wavelength spectrum, in the green visible wavelength spectrum, or in the red visible wavelength spectrum. In other embodiments, NSs 1700 can include a first population of NSs having sizes that emit in the blue visible wavelength spectrum, a second population of NSs having sizes that emit in the green visible wavelength spectrum, and a third population of NSs that emit in the red visible wavelength spectrum.

Matrix material 1810 can be any suitable host matrix material capable of housing NSs 1700. Suitable matrix materials may be chemically and optically compatible with NSs 1700 and any surrounding packaging materials or layers used in applying NS film 1800 to devices. Suitable matrix materials may include non-yellowing optical materials which are transparent to both the primary and secondary light, thereby allowing for both primary and secondary light to transmit through the matrix material. In an embodiment, matrix material 1810 can completely surround each of the NSs 1700. The matrix material 1810 can be flexible in applications where a flexible or moldable NS film 1800 is desired. Alternatively, matrix material 1810 can include a high-strength, non-flexible material.

Matrix material 1810 can include polymers, other semiconducting nanoparticles, organic and inorganic oxides, or other semiconducting or insulating materials. Suitable polymers for use in matrix material 1810 can be any polymer known to the ordinarily skilled artisan that can be used for such a purpose. The polymer may be substantially translucent or substantially transparent. Matrix material 1810 can include, but not limited to, epoxies, acrylates, norbornene, polyethylene, poly(vinyl butyral):poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides which combine with ligand amines (e.g., APS or PEI ligand amines) to form epoxy, and the like.

In some embodiments, matrix material 1810 includes scattering microbeads such as TiO2 microbeads, ZnS microbeads, or glass microbeads that may improve photo conversion efficiency of NS film 1800. In some embodiments, matrix material 1810 can include conductive or semiconductive materials.

In another embodiment, matrix material 1810 can have low oxygen and moisture permeability, exhibit high photo- and chemical-stability, exhibit favorable refractive indices, and adhere to outer surfaces of NSs 1700, thus providing an air-tight seal to protect NSs 1700. In another embodiment, matrix material 1810 can be curable with UV or thermal curing methods to facilitate roll-to-roll processing.

According to some embodiments, NS film 1800 can be formed by mixing NSs 1700 in a polymer (e.g., photoresist) and casting the NS-polymer mixture on a substrate, mixing NSs 1700 with monomers and polymerizing them together, mixing NSs 1700 in a sol-gel to form an oxide, or any other method known to those skilled in the art.

Example Embodiments of Luminescent Nanostructures

Described herein are various compositions having luminescent nanostructures (NSs). The various properties of the luminescent nanostructures, including their absorption properties, emission properties and refractive index properties, may be tailored and adjusted for various applications.

The material properties of NSs may be substantially homogenous, or in certain embodiments, may be heterogeneous. The optical properties of NSs may be determined by their particle size, chemical or surface composition. The ability to tailor the luminescent NS size in the range between about 1 nm and about 20 nm may enable photoemission coverage in the entire optical spectrum to offer great versatility in color rendering. Particle encapsulation may offer robustness against chemical and UV deteriorating agents.

Luminescent NSs, for use in embodiments described herein may be produced using any method known to those skilled in the art. Suitable methods and example nanocrystals are disclosed in U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties.

Luminescent NSs for use in embodiments described herein may be produced from any suitable material, including an inorganic material, and more suitably an inorganic conductive or semiconductive material. Suitable semiconductor materials may include those disclosed in U.S. patent application Ser. No. 10/796,832, and may include any type of semiconductor, including group II-VI, group III-V, group IV-VI, group and group IV semiconductors. Suitable semiconductor materials may include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SuS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, CuInGaS, CuInGaSe, and an appropriate combination of two or more such semiconductors.

In certain embodiments, the luminescent NSs may have a dopant from the group consisting of a p-type dopant or an n-type dopant. The NSs may also have II-VI or III-V semiconductors. Examples of II-VI or III-V semiconductor NSs may include any combination of an element from Group II, such as Zn, Cd and Hg, with any element from Group VI, such as S, Se, Te and Po, of the Periodic Table; and any combination of an element from Group III, such as B, Al, Ga, In, and Tl, with any element from Group V, such as N, P, As, Sb and Bi, of the Periodic Table.

The luminescent NSs, described herein may also further include ligands conjugated, cooperated, associated or attached to their surface. Suitable ligands may include any group known to those skilled in the art, including those disclosed in U.S. Pat. No. 8,283,412; U.S. Patent Publication No. 2008/0237540; U.S. Patent Publication No. 2010/0110728; U.S. Pat. Nos. 8,563,133; 7,645,397; 7,374,807; 6,949,206; 7,572,393; and 7,267,875, the disclosures of each of which are incorporated herein by reference. Use of such ligands may enhance the ability of the luminescent NSs to incorporate into various solvents and matrixes, including polymers. Increasing the miscibility (i.e., the ability to be mixed without separation) of the luminescent NSs in various solvents and matrixes may allow them to be distributed throughout a polymeric composition such that the NSs do not aggregate together and therefore do not scatter light. Such ligands are described as "miscibility-enhancing" ligands herein.

In certain embodiments, compositions having luminescent NSs distributed or embedded in a matrix material are provided. Suitable matrix materials may be any material known to the ordinarily skilled artisan, including polymeric materials, organic and inorganic oxides. Compositions described herein may be layers, encapsulants, coatings, sheets or films. It should be understood that in embodiments described herein where reference is made to a layer, polymeric layer, matrix, sheet or film, these terms are used interchangeably, and the embodiment so described is not limited to any one type of composition, but encompasses any matrix material or layer described herein or known in the art.

Down-converting NSs (for example, as disclosed in U.S. Pat. No. 7,374,807) utilize the emission properties of luminescent nanostructures that are tailored to absorb light of a particular wavelength and then emit at a second wavelength, thereby providing enhanced performance and efficiency of active sources (e.g., LEDs).

While any method known to the ordinarily skilled artisan may be used to create luminescent NSs, a solution-phase colloidal method for controlled growth of inorganic nanomaterial phosphors may be used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," *J. Am. Chem. Soc.* 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," *J Am. Chem. Soc.* 115:8706 (1993), the disclosures of which are incorporated by reference herein in their entireties.

According to an embodiment, CdSe may be used as the NS material, in one example, for visible light down-conversion, due to the relative maturity of the synthesis of this material. Due to the use of a generic surface chemistry, it may also possible to substitute non-cadmium-containing NSs.

In semiconductor NSs, photo-induced emission arises from the band edge states of the NS. The band-edge emission from luminescent NSs competes with radiative and non-radiative decay channels originating from surface electronic states. X. Peng, et al., *J Am. Chem. Soc.* 30:7019-7029 (1997). As a result, the presence of surface defects such as dangling bonds provide non-radiative recombination centers and contribute to lowered emission efficiency. An efficient and permanent method to passivate and remove the surface trap states may be to epitaxially grow an inorganic shell material on the surface of the NS. X. Peng, et al., *J. Am. Chem. Soc.* 30:701 9-7029 (1997). The shell material may be chosen such that the electronic levels are type 1 with respect to the core material (e.g., with a larger bandgap to provide a potential step localizing the electron and hole to the core). As a result, the probability of non-radiative recombination may be reduced.

Core-shell structures may be obtained by adding organometallic precursors containing the shell materials to a reaction mixture containing the core NSs. In this case, rather than a nucleation event followed by growth, the cores act as the nuclei, and the shells may grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and to ensure solubility. A uniform and epitaxially grown shell may be obtained when there is a low lattice mismatch between the two materials.

Example materials for preparing core-shell luminescent NSs may include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, Pb Se, PbTe, CuP, CuCl, CuBr, CuI, $Si_3N_4$, $Ge_3N_4$, $Al_2O_3$, $(Al, Ga, In)_2 (S, Se, Te)_3$, AlCO, and shell luminescent NSs for use in the practice of the present invention include, but are not limited to, (represented as Core/Shell), CdSe/ZnS, InP/ZnS, InP/ZnSe, PbSe/PbS, CdSe/CdS, CdTe/CdS, CdTe/ZnS, as well as others.

Luminescent NSs for use in the embodiments described herein may be less than about 100 nm in size, and down to less than about 1 nm in size and absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. Blue light may comprise light between about 435 nm and about 495 nm, green light may comprise light between about 495 nm and 570 nm and red light may comprise light between about 620 nm and about 750 nm in wavelength.

According to various embodiments, the luminescent NSs may have a size and a composition such that they absorb photons that are in the ultraviolet, near-infrared, and/or infrared spectra. The ultraviolet spectrum may comprise light between about 100 nm to about 400 nm, the near-infrared spectrum may comprise light between about 750 nm to about 100 μm in wavelength, and the infrared spectrum may comprise light between about 750 nm to about 300 μm in wavelength.

While luminescent NSs of other suitable material may be used in the various embodiments described herein, in certain embodiments, the NSs may be ZnSe, ZnTe, ZnS, InAs, InP, CdSe, or any combination thereof to form a population of nanocrystals for use in the embodiments described herein. As discussed above, in further embodiments, the luminescent NSs may be core/shell nanocrystals, such as CdSe/ZnS, InP/ZnSe, CdSe/CdS or InP/ZnS.

Suitable luminescent nanostructures, methods of preparing luminescent nanostructures, including the addition of various solubility-enhancing ligands, can be found in Published U.S. Patent Publication No. 2012/0113672, the disclosure of which is incorporated by reference herein in its entirety.

It is to be understood that while certain embodiments have been illustrated and described herein, the claims are not to be limited to the specific forms or arrangement of parts described and shown. In the specification, there have been disclosed illustrative embodiments and, although specific terms are employed, they are used in a generic and descriptive sense only and not for purposes of limitation. Modifications and variations of the embodiments are possible in light of the above teachings. It is therefore to be understood that the embodiments may be practiced otherwise than as specifically described.

What is claimed is:
1. A display device comprising:
   a first sub-pixel comprising:
      a first light source having a multi-layer stack comprising a quantum dot (QD) based phosphor film con- figured to emit a first light having a first peak wavelength, wherein the QD-based phosphor film comprises a population of luminescent nanostructures configured to emit red or green light, and
a first substrate configured to support the first light source and comprising a first control circuitry configured to independently control the first light source; and
a second sub-pixel comprising:
a second light source having a microLED or a miniLED configured to emit a second light having a second peak wavelength that is different from the first peak wavelength; and
a second substrate configured to support the second light source and comprising a second control circuitry configured to independently control the second light source.

2. The display device of claim 1, wherein the first peak wavelength is a primary emission peak wavelength in a red, green, cyan, yellow, or magenta wavelength region of an electromagnetic (EM) spectrum and the second peak wavelength is a primary emission peak wavelength in a blue, violet, or ultraviolet wavelength region of the EM spectrum.

3. The display device of claim 1, wherein the microLED comprises a wafer that has a lateral dimension less than about 100 µm and the miniLED comprises a wafer that has a lateral dimension between about 100 µm and about 10000 µm.

4. The display device of claim 1, wherein the multi-layer stack further comprises a reflective cathode and a transparent or semitransparent anode; and
wherein the QD-based phosphor film is positioned between the reflective cathode and the transparent or semitransparent anode.

5. The display device of claim 1, wherein the first sub-pixel is configured to emit red or green light through the first substrate and the second sub-pixel is configured to emit blue light through the second substrate.

6. The display device of claim 1, wherein the display device is a bottom emission display device.

7. The display device of claim 1, wherein the second sub-pixel further comprises a phosphor film with nanostructures disposed between the second light source and the second substrate.

8. The display device of claim 1, wherein the second sub-pixel further comprises a color processing element disposed between the second light source and the second substrate.

9. A display device having a pixel, the pixel comprising:
first and second emission layers configured to emit first and second light having first and second peak wavelengths that are output from first and second sub-pixels of the pixel, respectively;
a cathode configured to provide negative charges to the first and second emission layers;
an anode configured to provide positive charges to the first and second emission layers,
wherein the first and second emission layers are positioned between the cathode and the anode;
a light source having a microLED or a miniLED configured to emit a third light that is output from a third sub-pixel of the pixel, the third light having a third peak wavelength different from the first and second wavelengths; and
a color processing element disposed between the light source and a substrate of the pixel.

10. The display device of claim 9, wherein the first and second emission layers are positioned on first and second substrates, respectively.

11. The display device of claim 9, wherein the first and second emission layers comprise organic phosphor films or QD-based phosphor film.

12. The display device of claim 9, further comprising first and second distributed Bragg reflectors (DBRs) configured to form optical cavities between the cathode and the first and second DBRs.

13. The display device of claim 9, further comprising first and second distributed Bragg reflectors (DBRs) configured to form optical cavities between the anode and the first and second DBRs.

14. The display device of claim 9, wherein the microLED comprises a wafer that has a lateral dimension less than about 100 µm and the miniLED comprises a wafer that has a lateral dimension between about 100 µm and about 10000 µm.

15. The display device of claim 9, wherein the third peak wavelength is a primary emission peak electromagnetic (EM) spectrum wavelength in a blue, violet, or ultra-violet wavelength region of an electromagnetic (EM) spectrum.

16. A display device having a pixel, the pixel comprising:
a first light source having a first multi-layer stack comprising an organic phosphor film or a quantum dot (QD) based phosphor film configured to emit a first light having a first peak wavelength;
a second light source having a second multi-layer stack comprising a phosphor film with nanostructures and a microLED or a miniLED configured to emit a second light having a second peak wavelength that is different from the first peak wavelength;
a reflective cathode configured to provide negative charges to the first and second multi-layer stacks; and
a transparent anode configured to provide positive charges to the first and second multi-layer stacks.

17. The display device of claim 16, wherein the second multi-layer stack further comprises a color processing element that does not include luminescent nanostructures.

18. The display device of claim 16, wherein the first multi-layer stack further comprises first and second distributed Bragg reflectors (DBRs) configured to form optical cavities between the reflective cathode and the first and second DBRs.

19. The display device of claim 16, wherein the second peak wavelength is a primary emission peak electromagnetic (EM) spectrum wavelength in a blue, violet, or ultraviolet wavelength region of an electromagnetic (EM) spectrum.

* * * * *